(12) United States Patent
Baeg et al.

(10) Patent No.: US 9,941,192 B2
(45) Date of Patent: Apr. 10, 2018

(54) SEMICONDUCTOR DEVICE HAVING REPAIRABLE PENETRATION ELECTRODE

(71) Applicant: INDUSTRY-UNIVERSITY COOPERATION FOUNDATION HANYANG UNIVERSITY ERICA CAMPUS, Ansan-si, Gyeonggi-do (KR)

(72) Inventors: Sanghyeon Baeg, Seoul (KR); Sungsoo Chung, Ansan-si (KR)

(73) Assignee: INDUSTRY-UNIVERSITY COOPERATION FOUNDATION HANYANG UNIVERSITY ERICA CAMPUS, Ansan-si, Gyeonggi-do (KR)

( * ) Notice: Subject to any disclaimer, the term of this patent is extended or adjusted under 35 U.S.C. 154(b) by 0 days.

(21) Appl. No.: 15/318,093

(22) PCT Filed: Feb. 25, 2015

(86) PCT No.: PCT/KR2015/001786
§ 371 (c)(1),
(2) Date: Dec. 12, 2016

(87) PCT Pub. No.: WO2015/190670
PCT Pub. Date: Dec. 17, 2015

(65) Prior Publication Data
US 2017/0133299 A1    May 11, 2017

(30) Foreign Application Priority Data
Jun. 10, 2014   (KR) .................. 10-2014-0069928

(51) Int. Cl.
*H01L 23/48*     (2006.01)
*H01L 23/50*     (2006.01)
(Continued)

(52) U.S. Cl.
CPC ........... *H01L 23/481* (2013.01); *H01L 23/50* (2013.01); *H01L 23/525* (2013.01);
(Continued)

(58) Field of Classification Search
CPC .......... H01L 23/49827; H01L 23/5384; H01L 23/525; H01L 23/528; H01L 23/50;
(Continued)

(56) References Cited

U.S. PATENT DOCUMENTS

2010/0295600 A1   11/2010   Kim et al.
2011/0084758 A1    4/2011   Shibata et al.
(Continued)

FOREIGN PATENT DOCUMENTS

JP   2011-081887 A     4/2011
KR   10-2011-0108613 A   10/2011
(Continued)

OTHER PUBLICATIONS

International Search Report of PCT/KR2015/001786 dated May 26, 2015.

*Primary Examiner* — Jasmine Clark
(74) *Attorney, Agent, or Firm* — Sughrue Mion, PLLC

(57) ABSTRACT

A semiconductor device having a repairable penetration electrode is provided. The semiconductor device having the repairable penetration electrode includes first and second signal transfer regions including main penetration electrodes penetrating a substrate, and a repair region including a spare penetration electrode penetrating the substrate. The first and second signal transfer regions are spaced apart from each other. The repair region is disposed between the first and second signal transfer regions. The first and second signal transfer regions share the repair region such that the spare (Continued)

penetration electrode of the repair region is substituted for a defective main penetration electrode of the first and second signal transfer regions.

15 Claims, 22 Drawing Sheets

(51) Int. Cl.
  *H01L 23/525* (2006.01)
  *H01L 23/528* (2006.01)
  *H01L 25/065* (2006.01)

(52) U.S. Cl.
  CPC ........ *H01L 23/528* (2013.01); *H01L 25/0657* (2013.01); *H01L 2225/06513* (2013.01); *H01L 2225/06541* (2013.01)

(58) Field of Classification Search
  CPC ....... H01L 2924/00; H01L 2225/06544; H01L 2225/06513; H01L 2225/06541; H01L 23/481; H01L 25/0657; H01L 25/50
  See application file for complete search history.

(56) References Cited

U.S. PATENT DOCUMENTS

| | | | |
|---|---|---|---|
| 2011/0232078 A1 | 9/2011 | Yun et al. | |
| 2015/0084689 A1* | 3/2015 | Lee .................... | H01L 25/0657 327/565 |

FOREIGN PATENT DOCUMENTS

| | | |
|---|---|---|
| KR | 10-2011-0131976 A | 12/2011 |
| KR | 10-2012-0045366 A | 5/2012 |
| KR | 10-2012-0058156 A | 6/2012 |

* cited by examiner

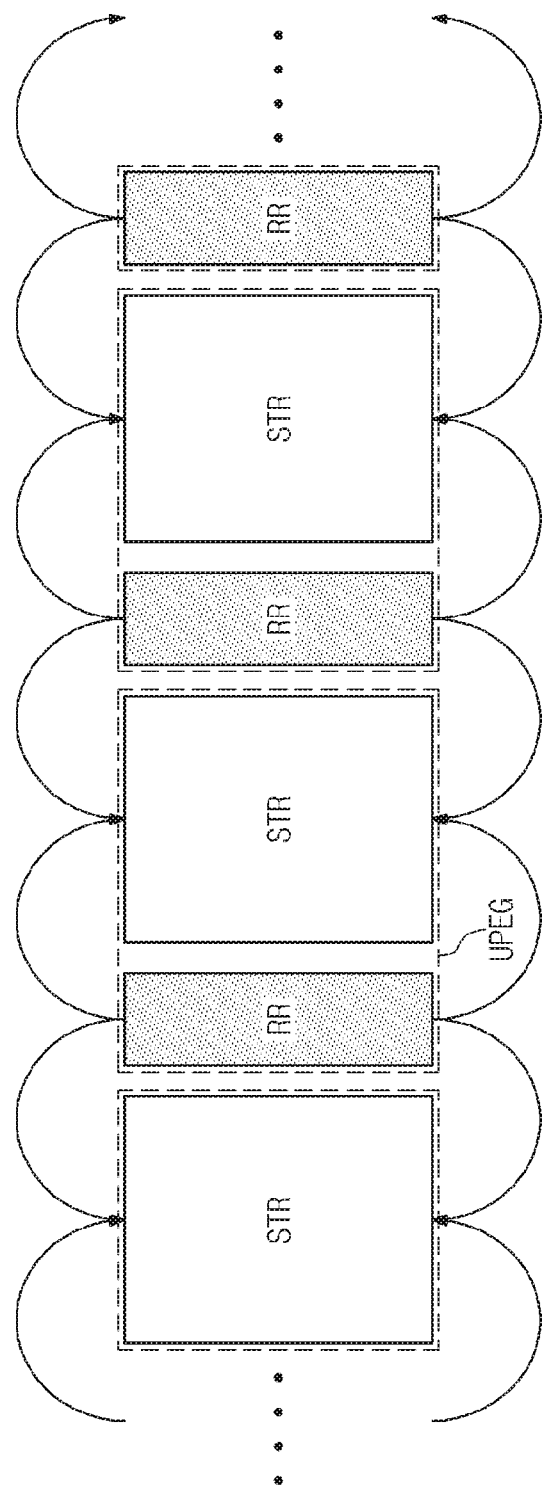

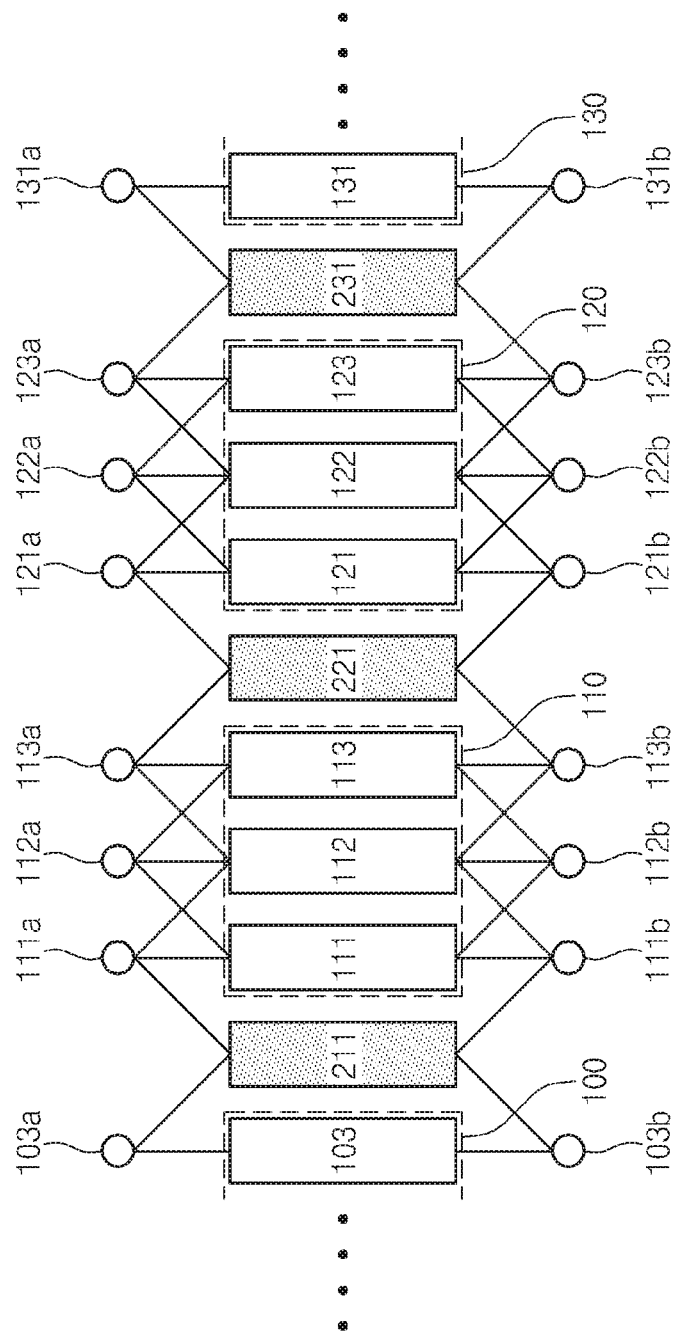

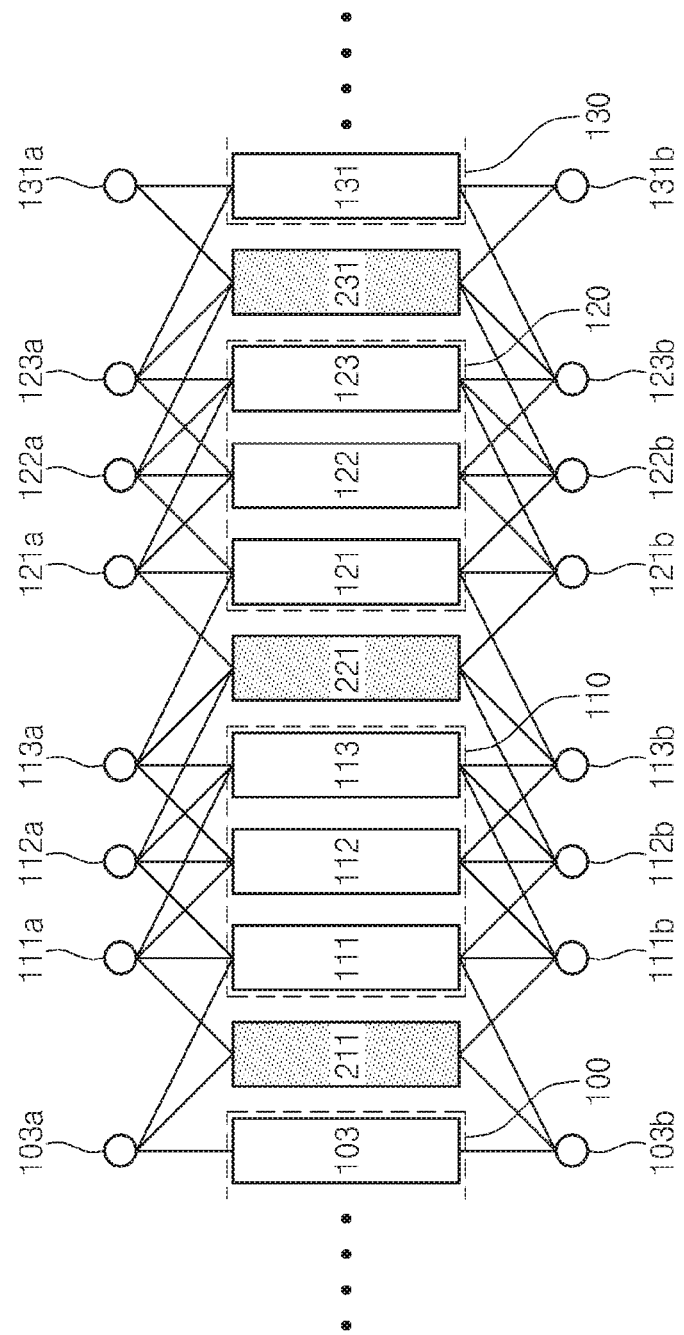

SEMICONDUCTOR DEVICE HAVING REPAIRABLE PENETRATION ELECTRODE

CROSS REFERENCE TO RELATED APPLICATIONS

This application is a National Stage of International Application No. PCT/KR2015/001786 filed Feb. 25, 2015, claiming priority based on Korean Patent Application No. 10-2014-0069928 filed Jun. 10, 2014, the contents of all of which are incorporated herein by reference in their entirety.

BACKGROUND

1. Field

Embodiments of the inventive concepts relate to a semiconductor device having a repairable penetration electrode. More particularly, embodiments of the inventive concepts relate to a semiconductor device having a repairable penetration electrode, which includes first and second signal transfer regions including main penetration electrodes and a repair region including a spare penetration electrode disposed between the first and second signal transfer regions, and which substitutes the spare penetration electrode of the repair region for a defective main penetration electrode when a defect occurs at the main penetration electrode of the first and second signal transfer regions.

2. Description of the Related Art

In a semiconductor industry, packaging techniques for integrated circuits have been developed to meet the demands for miniaturization and mounting reliability. For example, the demand for the miniaturization accelerates the development of techniques for packages closer to a chip size, and the demand for the mounting reliability highlights the importance of packaging techniques capable of improving the efficiency of mounting operations and mechanical and electrical reliability after the mounting operations.

The term "stack" used in the semiconductor industry means a technique for vertically stacking at least two semiconductor chips or packages. The stack technique can realize a product having a memory capacity greater than a memory capacity realized by a semiconductor integration process. In addition, the stack technique may mean a method for stacking packaged individual semiconductor chips.

Recently, as miniaturization of products, high package density, high performance, and integration demand between chips have continuously increased, three-dimensional (3D) package techniques have been developed. A through silicon via (TSV) technique is an important technique used in 3D packages of silicon devices. Conventional silicon chips have a structure in which electrodes exist only on a surface for external connection. However, a connecting electrode structure is formed to penetrate front and back surfaces of a chip in the TSV technique, and chips having the connecting electrode structures are three-dimensionally stacked.

For example, Korean Patent Publication No. 10-2012-0071921 (Application No. 10-2010-133657) discloses a composition that fills a hole of a through silicon via by using metal powder, solder powder, thermosetting resin, a reducing agent, and a hardening agent.

SUMMARY

Embodiments of the inventive concepts may provide a semiconductor device having a repairable penetration electrode, which has a spare penetration electrode capable of efficiently repairing a defective main penetration electrode when a defect occurs at the main penetration electrode.

In an aspect, a semiconductor device having a repairable penetration electrode may include input nodes, output nodes, and penetration electrodes disposed between the input nodes and the output nodes and penetrating a substrate. The penetration electrodes may include main penetration electrodes connected to the input nodes and the output nodes to transmit input/output (I/O) signals, and a spare penetration electrode. The main penetration electrodes adjacent to each other may constitute a group, and the group may include a first group and a second group. The spare penetration electrode may be disposed between the first group and the second group, and the input nodes and the output nodes corresponding to the first and second groups may be connected to the spare penetration electrode. When a defect occurs at the main penetration electrodes of the first and second groups, the spare penetration electrode may be substituted for the defective main penetration electrode of the first and second groups to transmit the I/O signal.

In some embodiments, the spare penetration electrode may include spare penetration electrodes that are provided at both sides of the first group, respectively. At least two of the input nodes corresponding to the first group may be connected to the spare penetration electrodes provided at both sides of the first group, and at least two of the output nodes corresponding to the first group may be connected to the spare penetration electrodes provided at both sides of the first group.

In some embodiments, at least one of the output nodes and/or the input nodes corresponding to the first group may be electrically disconnected from the spare penetration electrodes.

In some embodiments, at least one of the input nodes corresponding to the first group and/or the output nodes corresponding to the first group may be connected to the main penetration electrode included in the first group, the spare penetration electrode adjacent to the first group, and the main penetration electrode included in the second group adjacent to the first group. When a defect occurs at the main penetration electrode of the first group, the spare penetration electrode and/or the main penetration electrode of the second group connected to the at least one node may be substituted for the defective main penetration electrode of the first group to transmit the I/O signal.

In some embodiments, the second group may be adjacent to the first group in a direction that is parallel to a top surface of the substrate and that is perpendicular to an arrangement direction of the main penetration electrodes included in the first group.

In some embodiments, the number of the input nodes and/or the number of the output nodes may be equal to the number of the main penetration electrodes.

In some embodiments, the input nodes and/or the output nodes may be connected to the same number of the penetration electrodes.

In some embodiments, the number of the main penetration electrode connected to one of the input nodes may be different from the number of the main penetration electrode connected to another of the input nodes, and the number of the spare penetration electrode connected to one of the input nodes may be different from the number of the spare penetration electrode connected to another of the input nodes.

In some embodiments, the number of the main penetration electrode connected to one of the output nodes may be different from the number of the main penetration electrode connected to another of the output nodes, and the number of the spare penetration electrode connected to one of the output nodes may be different from the number of the spare penetration electrode connected to another of the output nodes.

In some embodiments, the number of the main penetration electrode connected to the input nodes and/or the output nodes may be more than the number of the spare penetration electrode connected to the input nodes and/or the output nodes.

In some embodiments, the spare penetration electrode may include spare penetration electrodes that are provided at both sides of the first group, respectively. Each of the input nodes corresponding to the first group and each of the output nodes corresponding to the first group may be connected to one of the main penetration electrodes of the first group and the spare penetration electrodes provided at both sides of the first group. When a defect occurs at the main penetration electrode of the first group, any one of the spare penetration electrodes provided at both sides of the first group may be substituted for the defective main penetration electrode to transmit the I/O signal.

In some embodiments, the group may further include a third group spaced apart from the first group with the second group interposed therebetween. The spare penetration electrode may include: a first spare penetration electrode provided at a side of the third group adjacent to the second group, and a second spare penetration electrode provided at another side of the third group. The input nodes and the output nodes corresponding to the third group may be connected to the first and second spare penetration electrodes. When a defect occurs at the main penetration electrode of the third group, any one of the first and second spare penetration electrodes may be substituted for the defective main penetration electrode of the third group to transmit the I/O signal.

In some embodiments, at least one of the input nodes and the output nodes corresponding to the first group may be connected to the second spare penetration electrode. When a defect occurs at the main penetration electrode included in the first group, the second spare penetration electrode may be substituted for the defective main penetration electrode of the first group to transmit the I/O signal.

In some embodiments, at least one of the input nodes and the output nodes corresponding to the first group may be connected to the main penetration electrode of the third group. When a defect occurs at the main penetration electrode of the first group, the main penetration electrode of the third group may be substituted for the defective main penetration electrode of the first group to transmit the I/O signal.

In some embodiments, the input nodes and the output nodes may include a multiplexer and/or a demultiplexer.

In another aspect, a semiconductor device having a repairable penetration electrode may include main penetration electrodes transmitting signals and penetrating a substrate, and spare penetration electrodes penetrating the substrate and disposed between the main penetration electrodes. The main penetration electrodes between the spare penetration electrodes may be defined as a group. When a defect occurs at the main penetration electrodes included in the group, at least one of the spare penetration electrodes provided at both sides of the group may be substituted for the defective main penetration electrode to transmit a signal.

In some embodiments, the group may be provided in plurality, and the plurality of groups may include the same number of the main penetration electrodes.

In some embodiments, the group includes a first group and a second group which are adjacent to each other. The first group and the second group may share the spare penetration electrode disposed between the first group and the second group. When a defect occurs at the main penetration electrodes included in the first and second groups, the spare penetration electrode between the first and second groups may be substituted for the defective main penetration electrode of the first and second groups.

In some embodiments, the group may include groups adjacent to each other, and a plurality of the spare penetration electrodes may be provided between the groups adjacent to each other.

In still another aspect, a semiconductor device having a repairable penetration electrode may include first and second signal transfer regions spaced apart from each other and including main penetration electrodes penetrating a substrate, and a repair region disposed between the first and second signal transfer regions and including a spare penetration electrode penetrating the substrate. The first and second signal transfer regions may share the repair region such that the spare penetration electrode of the repair region may be substituted for a defective main penetration electrode of the first and second signal transfer regions.

In some embodiments, the repair region may include a first repair region disposed at a side of the first signal transfer region and a second repair region disposed at another side of the first signal transfer region. The first signal transfer region may include a plurality of the main penetration electrodes. When a defect occurs at the main penetration electrodes of the first signal transfer region, the spare penetration electrodes of the first and second repair regions may be substituted for the defective main penetration electrodes of the first signal transfer region.

In some embodiments, each of the first and second signal transfer regions may include a plurality of the main penetration electrodes. The number of the main penetration electrodes of the first signal transfer region may be equal to the number of the main penetration electrodes of the second signal transfer region.

In some embodiments, the repair region may include a plurality of the spare penetration electrodes.

In some embodiments, the number of the spare penetration electrodes of the repair region may be less than the number of the main penetration electrodes of the first and second signal transfer regions.

BRIEF DESCRIPTION OF THE DRAWINGS

FIGS. 2A and 2B are views illustrating semiconductor devices having repairable penetration electrodes, according to example embodiments of the inventive concepts.

FIG. 3 is a view illustrating a semiconductor device having a repairable penetration electrode, according to a first embodiment of the inventive concepts.

FIG. 4 is a view illustrating a repairable semiconductor device according to a second embodiment of the inventive concepts.

DETAILED DESCRIPTION OF THE EMBODIMENTS

Figure 1:
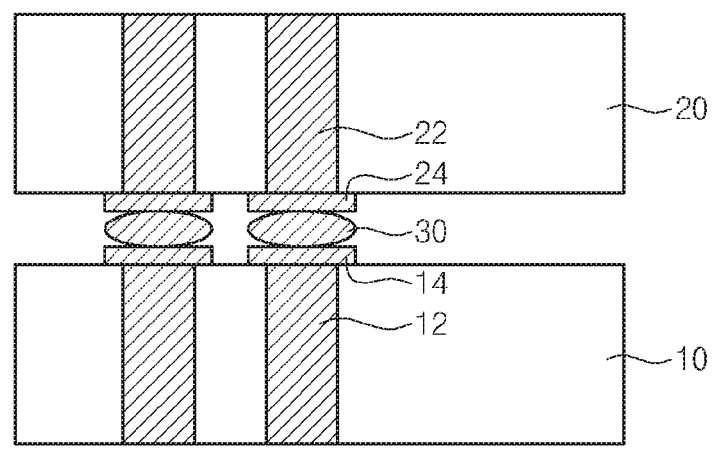
FIG. 1 is a schematic view illustrating a penetration electrode according to example embodiments of the inventive concepts.

The inventive concepts will now be described more fully hereinafter with reference to the accompanying drawings, in which exemplary embodiments of the inventive concepts are shown. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts.

It will be understood that when an element such as a layer, region or substrate is referred to as being "on" another element, it can be directly on the other element or intervening elements may be present. In addition, in the drawings, the thicknesses of layers and regions are exaggerated for clarity.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. As used herein, the term "and/or" includes any and all combinations of one or more of the associated listed items.

The terminology used herein is for the purpose of describing particular embodiments only and is not intended to limit the invention. As used herein, the singular terms "a", "an" and "the" are intended to include the plural forms as well, unless the context clearly indicates otherwise. It will be further understood that the terms "comprises", "comprising", "includes", "including", "have", "has" and/or "having" when used herein, specify the presence of stated features, integers, steps, operations, elements, and/or components, but do not preclude the presence or addition of one or more other features, integers, steps, operations, elements, components, and/or groups thereof. Furthermore, it will be understood that when an element is referred to as being "connected" or "coupled" to another element, it may be directly connected or coupled to the other element or intervening elements may be present.

In addition, in explanation of the present invention, the descriptions to the elements and functions of related arts may be omitted if they obscure the subjects of the inventive concepts.

FIG. 1 is a schematic view illustrating a penetration electrode according to example embodiments of the inventive concepts.

Referring to FIG. 1, a first semiconductor substrate 10 and a second semiconductor substrate 20 on the first semiconductor substrate 10 are provided. Each of the first and second semiconductor substrates 10 and 20 may include a semiconductor device (e.g., a memory and a transistor) and an interconnection line.

A first penetration electrode 12 may be provided to penetrate the first semiconductor substrate 10. A first pad 14 may be provided on the first penetration electrode 12. The first pad 14 may be provided on one surface of the first semiconductor substrate 10, which is adjacent to the second semiconductor substrate 20.

A second penetration electrode 22 may be provided to penetrate the second semiconductor substrate 20. A second pad 24 may be provided on the second penetration electrode 22. The second pad 24 may be provided on one surface of the second semiconductor substrate 20, which is adjacent to the first semiconductor substrate 10.

A bump 30 may be provided between the first pad 14 and the second pad 24. The first semiconductor substrate 10 and the second semiconductor substrate 20 may be electrically connected to each other through the first and second penetration electrodes 12 and 22, the first and second pads 14 and 24, and the bump 30.

Defects may occur at the first and second penetration electrodes 12 and 22 during a process of manufacturing the semiconductor device illustrated in FIG. 1 or during the use of the semiconductor device illustrated in FIG. 1. In this case, spare penetration electrodes may be added to the first and second semiconductor substrates 10 and 20, and it may be necessary to substitute the spare penetration electrodes for the first and second penetration electrodes 12 and 22 at which the defects occur.

Figure 2A:
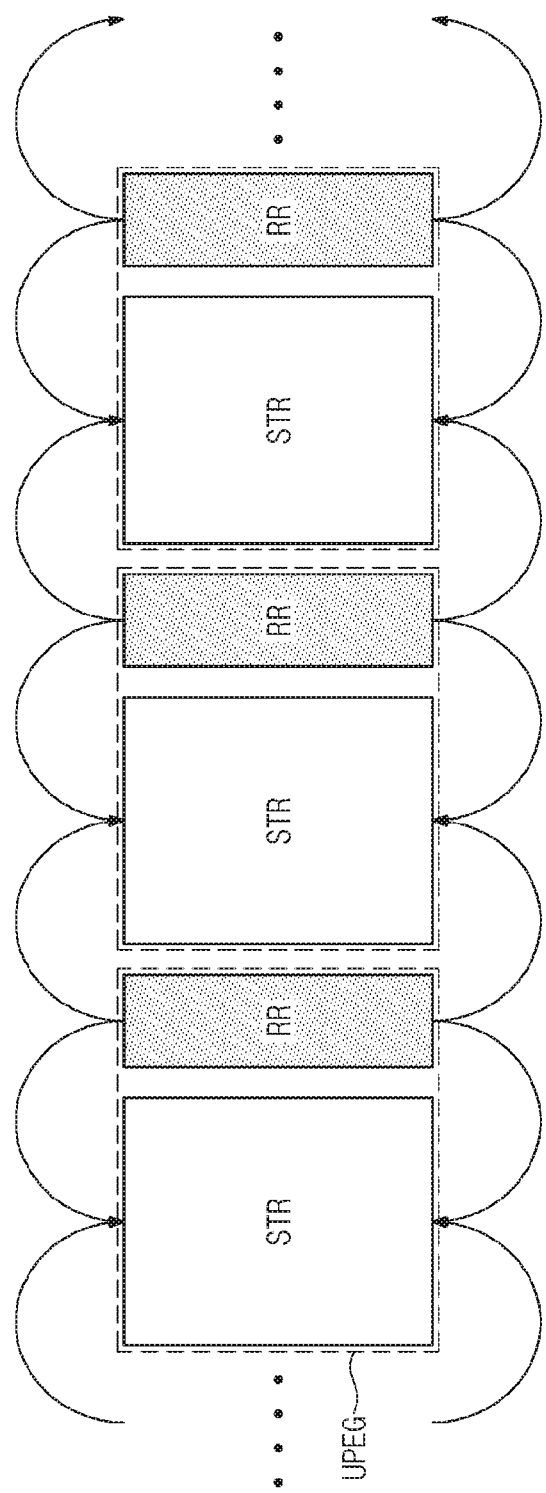

FIGS. 2A and 2B are views illustrating semiconductor devices having repairable penetration electrodes, according to example embodiments of the inventive concepts.

Referring to FIG. 2A, a semiconductor device having a repairable penetration electrode according to example embodiments of the inventive concepts may include a unit penetration electrode group UPEG including a signal transfer region STR and a repair region RR. The unit penetration electrode group UPEG may be provided in plurality. In some embodiments, the unit penetration electrode group UPEG may include one signal transfer region STR and one repair region RR.

The signal transfer region STR may include a main penetration electrode penetrating a semiconductor substrate. The main penetration electrode may transfer or transmit a signal between stacked semiconductor substrates, as described with reference to FIG. 1. Each of the signal transfer regions STR may include a plurality of the main penetration electrodes, and the numbers of the main penetration electrodes of the signal transfer regions STR may be equal to each other.

The repair region RR may include a spare penetration electrode penetrating the semiconductor substrate. When a defect occurs at the main penetration electrode, the spare penetration electrode may be substituted for the main penetration electrode and may transfer or transmit a signal between the stacked semiconductor substrates. The repair region RR may include a plurality of the spare penetration electrodes, and the number of the spare penetration electrodes included in the repair region RR may be less than the number of the main penetration electrodes included in the signal transfer region STR.

The repair region RR may be disposed between the signal transfer regions STR. In some embodiments, the signal transfer regions STR disposed at both sides of the repair region RR may share the repair region RR disposed between the signal transfer regions STR. In other words, when defects occur at the main penetration electrodes of the signal transfer regions STR disposed at both sides of the repair region RR, the spare penetration electrodes of the repair region RR may be substituted for the defective main penetration electrodes and may transfer signals. Thus, repair efficiency of a defect of a penetration electrode may be increased.

For example, when a first repair region is disposed between first and second signal transfer regions and defects occur at the main penetration electrodes of the first and second signal transfer regions, the spare penetration electrodes of the first repair region may be substituted for the defective main penetration electrodes of the first and second signal transfer regions. Thus, the spare penetration electrodes of the first repair region may transfer signals to repair the defects.

The repair region RR may include a first repair region disposed at a side of the first signal transfer region and a second repair region disposed at another side of the first signal transfer region. In this case, when defects occur at the main penetration electrodes of the first signal transfer region, the spare penetration electrodes of the first and second repair regions may be substituted for the defective main penetration electrodes of the first signal transfer region to transfer or transmit signals.

In FIG. 2A, the repair region RR is disposed at a right side of the signal transfer region STR in the unit penetration electrode group UPEG. Alternatively, the unit penetration electrode group UPEG may be defined to include the signal transfer region STR and the repair region RR disposed at a left side of the signal transfer region STR, as illustrated in FIG. 2B.

Semiconductor devices having repairable penetration electrodes according to various embodiments of the inventive concepts will be described hereinafter.

FIG. 3 is a view illustrating a semiconductor device having a repairable penetration electrode, according to a first embodiment of the inventive concepts.

Referring to FIG. 3, a semiconductor device having a repairable penetration electrode according to the first embodiment may include input nodes 103*a*, 111*a* to 113*a*, 121*a* to 123*a*, and 131*a*, output nodes 103*b*, 111*b* to 113*b*, 121*b* to 123*b*, and 131*b*, and penetration electrodes 103, 111 to 113, 121 to 123, 131, 211, 221, and 231.

The penetration electrodes 103, 111 to 113, 121 to 123, 131, 211, 221, and 231 may include main penetration electrodes 103, 111 to 113, 121 to 123, and 131 connected to the input nodes 103*a*, 111*a* to 113*a*, 121*a* to 123*a*, and 131*a* and the output nodes 103*b*, 111*b* to 113*b*, 121*b* to 123*b*, and 131*b* to transfer or transmit input/output (I/O) signals, and spare penetration electrodes 211, 221, and 231 substituted for defective ones of the main penetration electrodes 103, 111 to 113, 121 to 123, and 131 when the defective main penetration electrodes occur.

The main penetration electrodes 103, 111 to 113, 121 to 123, and 131 adjacent to each other may constitute each of groups 100, 110, 120, and 130. In some embodiments, the groups 100, 110, 120, and 130 may include the same number of the main penetration electrodes 103, 111 to 113, 121 to 123, and 131.

The spare penetration electrodes 211, 221, and 231 may be disposed between the groups 100, 110, 120, and 130. In other words, the groups 100, 110, 120, and 130 may be divided by the spare penetration electrodes 211, 221, and 231. For example, a first spare penetration electrode 211 may be disposed between a zeroth group 100 and a first group 110, a second spare penetration electrode 221 may be disposed between the first group 110 and a second group 120, and a third spare penetration electrode 231 may be disposed between the second group 120 and a third group 130.

The number of the input nodes 103*a*, 111*a* to 113*a*, 121*a* to 123*a*, and 131*a* and the number of the output nodes 103*b*, 111*b* to 113*b*, 121*b* to 123*b*, and 131*b* may be equal to the number of the main penetration electrodes 103, 111 to 113, 121 to 123, and 131. Each of the input nodes 103*a*, 111*a* to 113*a*, 121*a* to 123*a*, and 131*a* and the output nodes 103*b*, 111*b* to 113*b*, 121*b* to 123*b*, and 131*b* may be connected to the same number of the penetration electrodes. In FIG. 3, each of the input nodes 103*a*, 111*a* to 113*a*, 121*a* to 123*a*, and 131*a* and the output nodes 103*b*, 111*b* to 113*b*, 121*b* to 123*b*, and 131*b* is connected to three penetration electrodes. Alternatively, each of the input/output nodes 103*a*, 111*a* to 113*a*, 121*a* to 123*a*, 131*a*, 103*b*, 111*b* to 113*b*, 121*b* to 123*b*, and 131*b* may be connected to two, four, or more penetration electrodes.

Each of the input nodes 103*a*, 111*a* to 113*a*, 121*a* to 123*a*, and 131*a* and each of the output nodes 103*b*, 111*b* to 113*b*, 121*b* to 123*b*, and 131*b* may correspond to each of the main penetration electrodes 103, 111 to 113, 121 to 123, and 131 of the groups 100, 110, 120, and 130. The input nodes 103*a*, 111*a* to 113*a*, 121*a* to 123*a*, or 131*a* and the output nodes 103b, 111b to 113b, 121b to 123b, or 131b corresponding to each of the groups 100, 110, 120, and 130 may be connected to the main penetration electrodes 103, 111 to 113, 121 to 123, or 131 of each of the groups 100, 110, 120, and 130 and/or the spare penetration electrodes 211, 221, and/or 231 disposed at both sides of each of the groups 100, 110, 120, and 130.

Each of the input nodes 103a, 111a to 113a, 121a to 123a, and 131a and each of the output nodes 103b, 111b to 113b, 121b to 123b, and 131b may be connected to at least one of the main penetration electrodes of the corresponding one of the groups 100, 110, 120, and 130.

At least one of the input nodes 103a, 111a to 113a, 121a to 123a, and 131a and at least one of the output nodes 103b, 111b to 113b, 121b to 123b, and 131b may be connected to the spare penetration electrodes 211, 221, and/or 231 disposed at both sides of the corresponding one of the groups 100, 110, 120, and 130.

At least two of the input nodes 103a, 111a to 113a, 121a to 123a, and 131a or at least two of the output nodes 103b, 111b to 113b, 121b to 123b, and 131b may be connected to the spare penetration electrodes 211, 221, and/or 231 disposed at both sides of the corresponding one of the groups 100, 110, 120, and 130. At least one of the input nodes 103a, 111a to 113a, 121a to 123a, and 131a or at least one of the output nodes 103b, 111b to 113b, 121b to 123b, and 131b may be disconnected from the spare penetration electrodes 211, 221, and 231.

For example, the input/output nodes 111a to 113a and 111b to 113b corresponding to the first group 110 may be connected to the main penetration electrodes 111 to 113 of the first group 110 and/or the first and second spare penetration electrodes 211 and 221 at both sides of the first group 110. In more detail, first group first input/output nodes 111a and 111b may be connected to the first spare penetration electrode 211, a first group first main penetration electrode 111, and a first group second main penetration electrode 112. First group second input/output nodes 112a and 112b may be disconnected from the spare penetration electrodes 211, 221, and 231 and may be connected to the first group first main penetration electrode 111, the first group second main penetration electrode 112, and a first group third main penetration electrode 113. First group third input/output nodes 113a and 113b may be connected to the first group second main penetration electrode 112, the first group third main penetration electrode 113, and the second spare penetration electrode 221. Thus, when defects occur at the main penetration electrodes 111 to 113 included in the first group 110, the first and second spare penetration electrodes 211 and 221 may be substituted for the defective main penetration electrodes 111 to 113 of the first group 110 and may transfer or transmit I/O signals.

The input nodes 121a to 123a and the output nodes 121b to 123b corresponding to the second group 120 may be connected to the main penetration electrodes 121 to 123 of the second group 120 and/or the second and third spare penetration electrodes 221 and 231 disposed at both sides of the second group 120 by the same method as the input nodes 111a to 113a and the output nodes 111b to 113b corresponding to the first group 110 described above.

Thus, the input/output nodes 111a to 113a and 11b to 113b corresponding to the first group 110 and the input/output nodes 121a to 123a and 121b to 123b corresponding to the second group 120 may be connected to the second spare penetration electrode 221 disposed between the first group 110 and the second group 120. As a result, when defects occur at the main penetration electrodes 111 to 113 and 121 to 123 of the first group 110 and the second group 120, the second spare penetration electrode 221 may be substituted for the defective ones of the main penetration electrodes 111 to 113 and 121 to 123 of the first and second groups 110 and 120 to transfer or transmit I/O signals.

The number of the main penetration electrodes connected to one of the input nodes 103a, 111a to 113a, 121a to 123a, and 131a may be different from the number of the main penetration electrodes connected to another of the input nodes 103a, 111a to 113a, 121a to 123a, and 131a. For example, the first group first input node 111a may be connected to two main penetration electrodes 111 and 112, and the first group second input node 112a may be connected to three main penetration electrodes 111 to 113. The number of the main penetration electrodes connected to one of the output nodes 103b, 111b to 113b, 121b to 123b, and 131b may be different from the number of the main penetration electrodes connected to another of the output nodes 103b, 111b to 113b, 121b to 123b, and 131b. For example, the first group first output node 111b may be connected to two main penetration electrodes 111 and 112, and the first group second output node 112b may be connected to three main penetration electrodes 111 to 113.

The number of the spare penetration electrode connected to one of the input nodes 103a, 111a to 113a, 121a to 123a, and 131a may be different from the number of the spare penetration electrode connected to another of the input nodes 103a, 111a to 113a, 121a to 123a, and 131a. For example, the first group first input node 111a may be connected to one first spare penetration electrode 211, and the first group second input node 112a may be disconnected from the spare penetration electrodes 211, 221, and 231. The number of the spare penetration electrode connected to one of the output nodes 103b, 111b to 113b, 121b to 123b, and 131b may be different from the number of the spare penetration electrode connected to another of the output nodes 103b, 111b to 113b, 121b to 123b, and 131b. For example, the first group first output node 111b may be connected to one first spare penetration electrode 211, and the first group second output node 112b may be disconnected from the spare penetration electrodes 211, 221, and 231.

In the first embodiment described above, the input nodes 111a to 113a and the output nodes 111b to 113b corresponding to the first group 110 are connected to the main penetration electrodes 111 to 113 of the first group 110 and the first and second spare penetration electrodes 211 and 221 disposed at both sides of the first group 110. However, according to a second embodiment of the inventive concepts, the input nodes 111a to 113a and the output nodes 111b to 113b corresponding to the first group 110 may be connected to the main penetration electrode of another group. This will be described with reference to FIG. 4.

FIG. 4 is a view illustrating a repairable semiconductor device according to a second embodiment of the inventive concepts.

Referring to FIG. 4, according to the second embodiment of the inventive concepts, at least one of the input nodes 103a, 111a to 113a, 121a to 123a, and 131a and the output nodes 103b, 111b to 113b, 121b to 123b, and 131b may be connected to the main penetration electrode of another group adjacent to the group 100, 110, 120, or 130 corresponding thereto, unlike the semiconductor device having the repairable penetration electrode according to the first embodiment of the inventive concepts described with reference to FIG. 3.

For example, the first group third input/output nodes 113a and 113b corresponding to the first group 110 may be connected to the first group second main penetration electrode 112, the first group third main penetration electrode 113, and the second spare penetration electrode 221 and may be further connected to a second group first main penetration electrode 121 adjacent to the first group 110. Thus, when defects occur at the main penetration electrodes 111 to 113 of the first group 110, the first spare penetration electrode 211, the second spare penetration electrode 221, and the second group first main penetration electrode 121 may transfer or transmit I/O signals in substitution for the main penetration electrodes 111 to 113 of the first group 110 at which the defects occur.

Unlike the second embodiment of the inventive concepts described above, the input nodes 111a to 113a and the output nodes 111b to 113b corresponding to the first group 110 may be connected to a plurality of the main penetration electrodes included in other group(s) in a third embodiment of the inventive concepts. This will be described with reference to FIG. 5.

Figure 5:
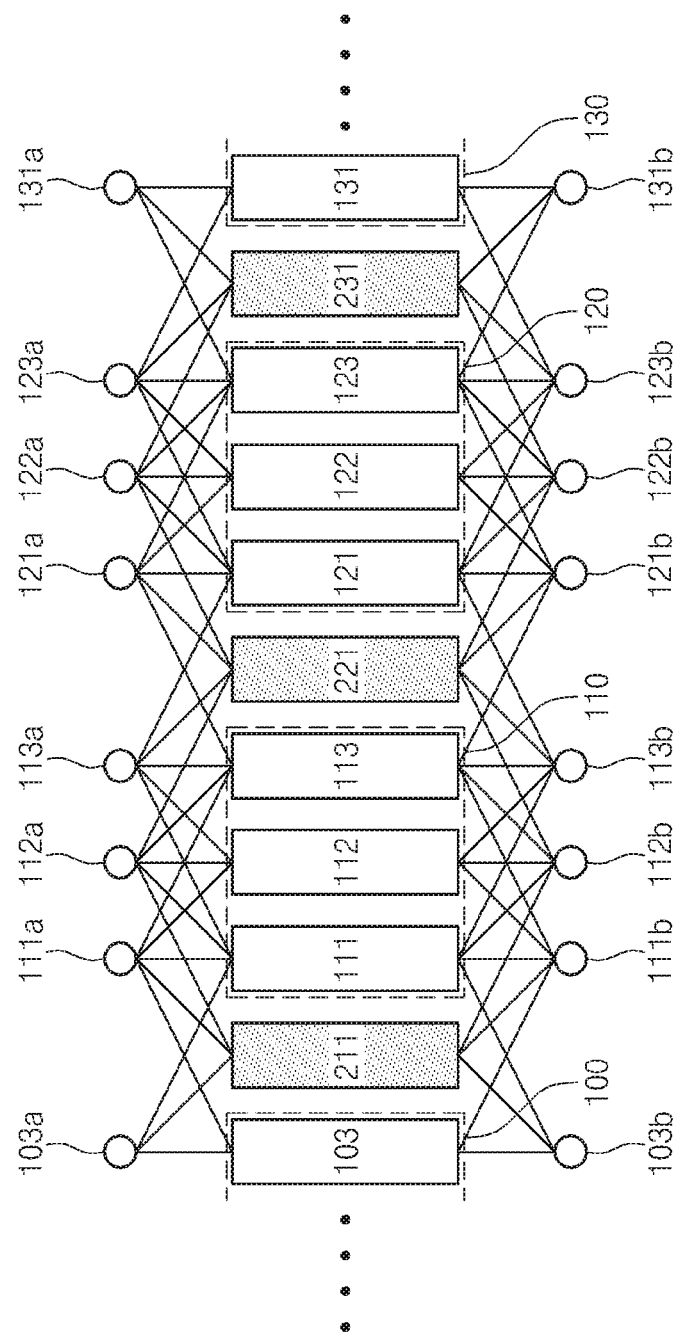
FIG. 5 is a view illustrating a semiconductor device having a repairable penetration electrode, according to a third embodiment of the inventive concepts.

FIG. 5 is a view illustrating a semiconductor device having a repairable penetration electrode, according to a third embodiment of the inventive concepts.

Referring to FIG. 5, according to the third embodiment of the inventive concepts, the input nodes 103a, 111a to 113a, 121a to 123a, or 131a and the output nodes 103b, 111b to 113b, 121b to 123b, or 131b may be connected to a plurality of main penetration electrodes included in other group(s) adjacent to the group 100, 110, 120, or 130 corresponding thereto, unlike the semiconductor device having the repairable penetration electrode according to the second embodiment of the inventive concepts described with reference to FIG. 4.

For example, the first group first input node 111a and the first group first output node 111b corresponding to the first group 110 may be connected to a zeroth group third main penetration electrode 103 adjacent to the first group 110, the first spare penetration electrode 211, the first group first main penetration electrode 111, the first group second main penetration electrode 112, and the first group third main penetration electrode 113. The first group third input node 113a and the first group third output node 113b corresponding to the first group 110 may be connected to the first group first main penetration electrode 111, the first group second main penetration electrode 112, the first group third main penetration electrode 113, the second spare penetration electrode 221, and the second group first main penetration electrode 121 adjacent to the first group 110. Thus, when defects occur at the main penetration electrodes 111 to 113 of the first group 110, the zeroth group third main penetration electrode 103, the first spare penetration electrode 211, the second spare penetration electrode 221, and the second group first main penetration electrode 121 may transfer or transmit I/O signals in substitution for the main penetration electrodes 111 to 113 of the first group 110 at which the defects occur.

Unlike the first to third embodiments of the inventive concepts described above, a plurality of spare penetration electrodes may be provided between groups adjacent to each other in a fourth embodiment of the inventive concepts. This will be described with reference to FIG. 6.

Figure 6:
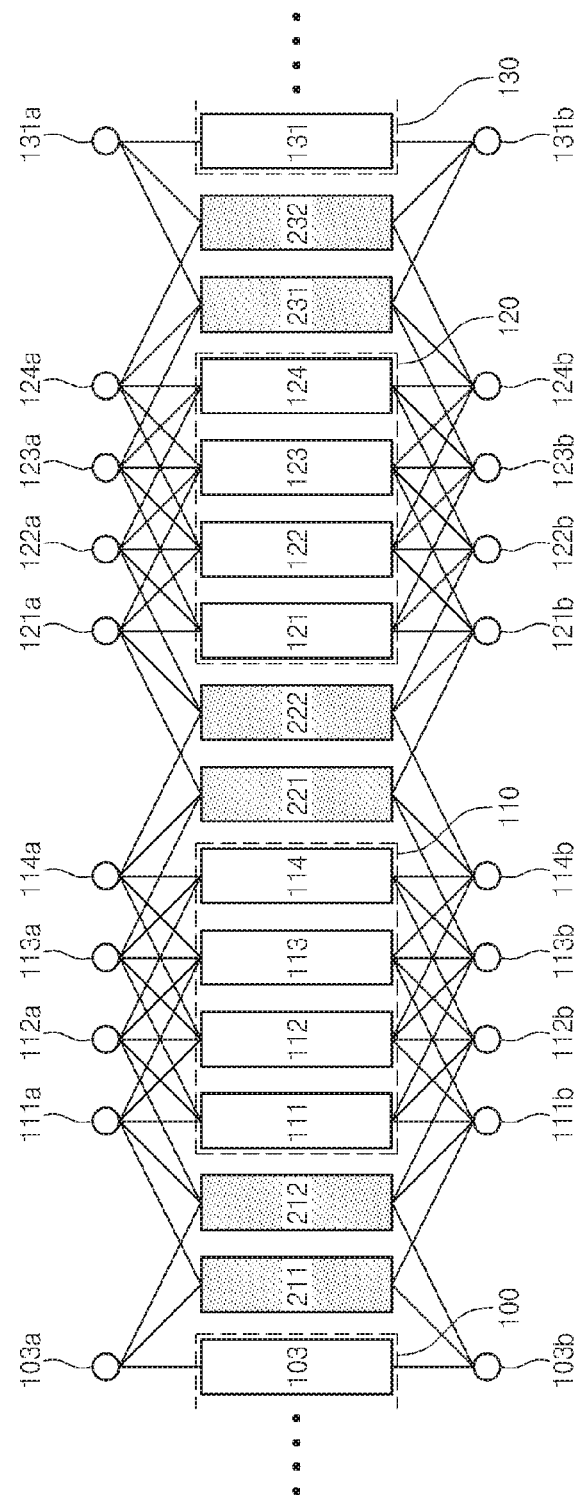
FIG. 6 is a view illustrating a semiconductor device having a repairable penetration electrode, according to a fourth embodiment of the inventive concepts.

FIG. 6 is a view illustrating a semiconductor device having a repairable penetration electrode, according to a fourth embodiment of the inventive concepts.

Referring to FIG. 6, according to the fourth embodiment of the inventive concepts, four main penetration electrodes 103, 111 to 114, 121 to 124, or 131 may be provided in each of the groups 100, 110, 120, and 130 and a plurality of spare penetration electrodes 211 and 212, 221 and 222, or 231 and 232 may be provided between the groups adjacent to each other.

The input nodes 103a, 111a to 114a, 121a to 124a, or 131a and the output nodes 103b, 111b to 114b, 121b to 124b, or 131b corresponding to each of the groups 100, 110, 120, and 130 may be connected to the main penetration electrodes 103, 111 to 114, 121 to 124, or 131 of the corresponding one of the groups 100, 110, 120, and 130 and the spare penetration electrodes 211, 212, 221, 222, 231, and/or 232 disposed at both sides of the corresponding one of the groups 100, 110, 120, and 130.

For example, the first group first input/output nodes 111a and 111b may be connected to first spare penetration electrodes 211 and 212 between the first group 110 and the zeroth group 100, and first group fourth input/output nodes 114a and 114b may be connected to second spare penetration electrodes 221 and 222 between the first group 110 and the second group 120. Thus, when defects occur at the main penetration electrodes 111 to 114 of the first group 110, the first spare penetration electrodes 211 and 212 and the second spare penetration electrodes 221 and 222 may transfer or transmit I/O signals in substitution for the main penetration electrodes 111 to 114 of the first group 110 at which the defects occur.

The spare penetration electrodes 211 and 212, 221 and 222, or 231 and 232 between the groups adjacent to each other may be connected to the input nodes 103a, 111a to 114a, 121a to 124a, or 131a and the output nodes 103b, 111b to 114b, 121b to 124b, or 131b of the groups disposed at both sides thereof.

For example, the second spare penetration electrodes 221 and 222 connected to the first group fourth input/output nodes 114a and 114b may also be connected to the second group first input/output nodes 121a and 121b. Thus, when defects occur at the main penetration electrodes 111 to 114 and 121 to 124 of the first group 110 and the second group 120, the second spare penetration electrodes 221 and 222 may be substituted for the defective ones of the main penetration electrodes 111 to 114 and 121 to 124 of the first and second groups 110 and 120 to transfer or transmit I/O signals.

Unlike the first to fourth embodiments described above, each of the input nodes and each of the output nodes may be connected to one main penetration electrode of the group corresponding thereto and spare penetration electrodes disposed at both sides of the corresponding group in a fifth embodiment of the inventive concepts. This will be described with reference to FIG. 7.

Figure 7:
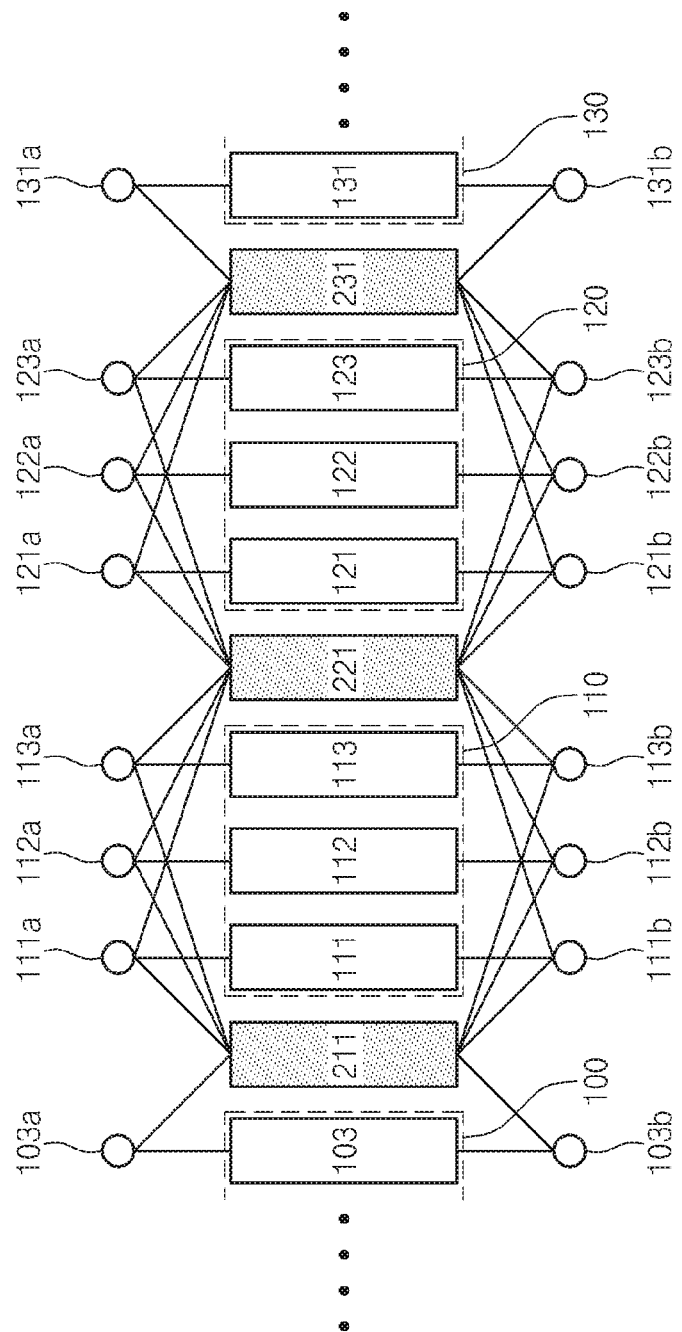
FIG. 7 is a view illustrating a semiconductor device having a repairable penetration electrode, according to a fifth embodiment of the inventive concepts.

FIG. 7 is a view illustrating a semiconductor device having a repairable penetration electrode, according to a fifth embodiment of the inventive concepts.

Referring to FIG. 7, according to the fifth embodiment of the inventive concepts, each of the input nodes 103a, 111a to 113a, 121a to 123a, and 131a and each of the output nodes 103b, 111b to 113b, 121b to 123b, and 131b may be connected to one main penetration electrode included in the group corresponding thereto and the spare penetration electrodes disposed at both sides of the corresponding group.

For example, the first group first input/output nodes 111a and 111b may be connected to the first group first main penetration electrode 111, the first spare penetration electrode 211 disposed at one side of the first group 110, and the second spare penetration electrode 221 disposed at another side of the first group 110. By the same manner as the first group first input/output nodes 111a and 111b, the first group second input/output nodes 112a and 112b may be connected to the first group second main penetration electrode 112 and the first and second spare penetration electrodes 211 and 221, and the first group third input/output nodes 113a and 113b may be connected to the first group third main penetration electrode 113 and the first and second spare penetration electrodes 211 and 221. Thus, when defects occur at the main penetration electrodes 111 to 113 of the first group 110, the first spare penetration electrode 211 and the second spare penetration electrode 221 may transfer or transmit I/O signals in substitution for the main penetration electrodes 111 to 113 of the first group 110 at which the defects occur.

Each of the spare penetration electrodes 211, 221, and 232 between the groups 100, 110, 120, and 130 may be connected to the input nodes 103a, 111a to 113a, 121a to 123a, or 131a and the output nodes 103b, 111b to 113b, 121b to 123b, or 131b of the groups disposed at both sides thereof.

For example, the second spare penetration electrode 221 may be connected to the first group first to third input/output nodes 111a, 111b, 112a, 112b, 113a, and 113b and the second group first to third input/output nodes 121a, 121b, 122a, 122b, 123a, and 123b. Thus, when a defect occurs at the main penetration electrodes 111 to 113 and 121 to 123 of the first and second groups 110 and 120, the second spare penetration electrode 221 may be substituted for the defective one(s) of the main penetration electrodes 111 to 113 and 121 to 123 of the first and second groups 110 and 120 to transfer or transmit I/O signals.

Unlike the fifth embodiment of the inventive concepts described above, a plurality of spare penetration electrodes may be provided between groups adjacent to each other in a modified example of the fifth embodiment of the inventive concepts. This will be described with reference to FIG. 8.

Figure 8:
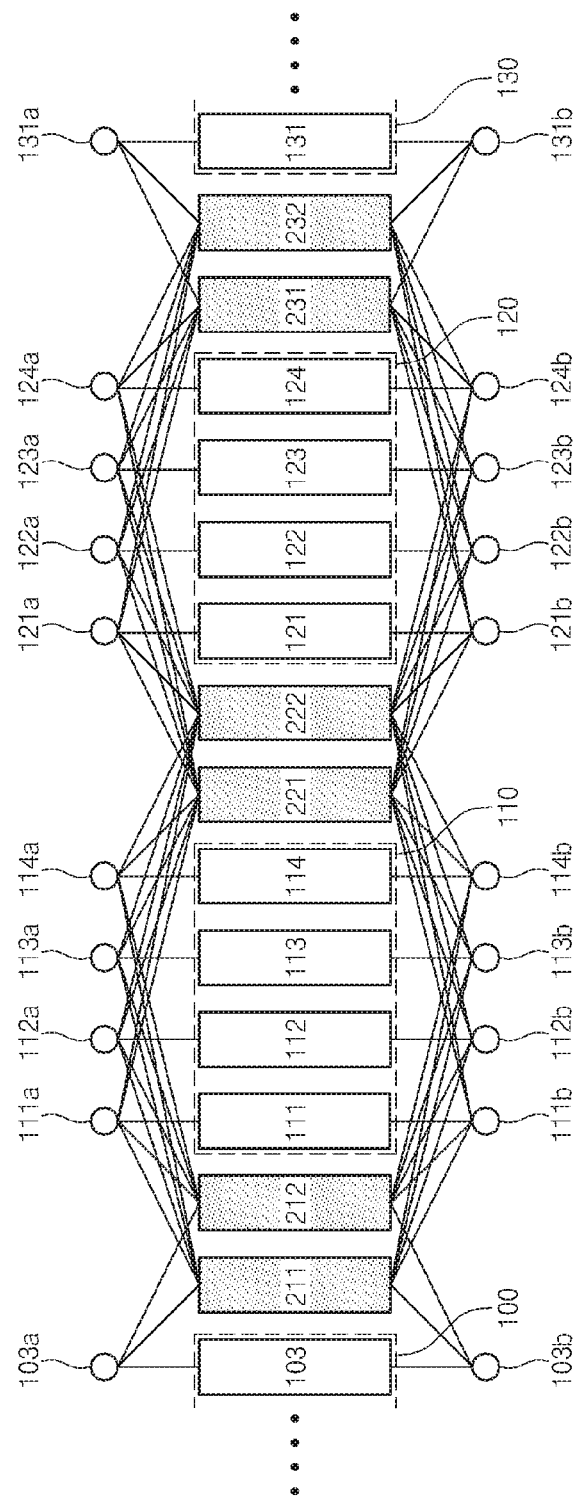
FIG. 8 is a view illustrating a semiconductor device having a repairable penetration electrode, according to a modified example of the fifth embodiment of the inventive concepts.

FIG. 8 is a view illustrating a semiconductor device having a repairable penetration electrode, according to a modified example of the fifth embodiment of the inventive concepts.

Referring to FIG. 8, according to the modified example of the fifth embodiment of the inventive concepts, four main penetration electrodes 103, 111 to 114, 121 to 124, or 131 may be provided in each of the groups 100, 110, 120, and 130 and a plurality of spare penetration electrodes 211 and 212, 221 and 222, or 231 and 232 may be provided between the groups adjacent to each other, unlike the fifth embodiment described above.

Each of the input nodes 103a, 111a to 114a, 121a to 124a, and 131a and each of the output nodes 103b, 111b to 114b, 121b to 124b, and 131b may be connected to one main penetration electrode included in the group corresponding thereto and the spare penetration electrodes disposed at both sides of the corresponding group.

For example, the first group first input/output nodes 111a and 111b may be connected to the first group first main penetration electrode 111, the first spare penetration electrodes 211 and 212 disposed at one side of the first group 110, and the second spare penetration electrodes 221 and 222 disposed at another side of the first group 110. The first group second to fourth input/output nodes 112a, 112b, 113a, 113b, 114a, and 114b may be connected to the first group second to fourth main penetration electrodes 112, 113, and 114 and the first and second spare penetration electrodes 211, 212, 221, and 222 by the same manner as the first group first input/output nodes 111a and 111b. Thus, when defects occur at the main penetration electrodes 111 to 114 of the first group 110, the first spare penetration electrodes 211 and 212 and the second spare penetration electrodes 221 and 222 may transfer or transmit I/O signals in substitution for the main penetration electrodes 111 to 114 of the first group 110 at which the defects occur.

The spare penetration electrodes 211 and 212, 221 and 222, or 231 and 232 between the groups adjacent to each other may be connected to the input nodes 103a, 111a to 114a, 121a to 124a, or 131a and the output nodes 103b, 111b to 114b, 121b to 124b, or 131b of the groups disposed at both sides thereof.

For example, the second spare penetration electrodes 221 and 222 may be connected to the input/output nodes 111a to 114a and 111b to 114b corresponding to the first group 110 and the input/output nodes 121a to 124a and 121b to 124b corresponding to the second group 120. Thus, when defects occur at the main penetration electrodes 111 to 114 and 121 to 124 of the first group 110 and the second group 120, the second spare penetration electrodes 221 and 222 may transfer or transmit I/O signals in substitution for the defective ones of the main penetration electrodes 111 to 114 and 121 to 124 of the first and second groups 110 and 120.

Unlike the embodiments described above, input nodes and output nodes may be connected to a spare penetration electrode spaced apart from the group corresponding thereto in a sixth embodiment of the inventive concepts. This will be described with reference to FIG. 9.

Figure 9:
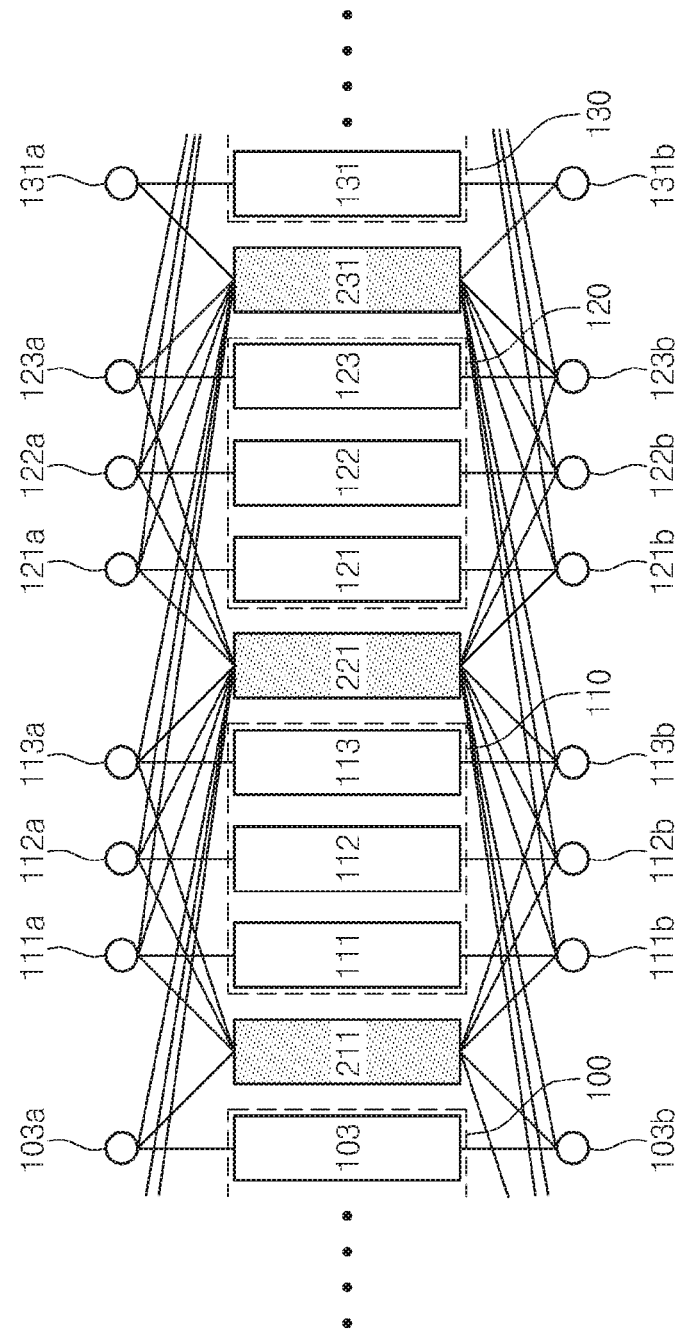
FIG. 9 is a view illustrating a semiconductor device having a repairable penetration electrode, according to a sixth embodiment of the inventive concepts.

FIG. 9 is a view illustrating a semiconductor device having a repairable penetration electrode, according to a sixth embodiment of the inventive concepts.

Referring to FIG. 9, according to the sixth embodiment of the inventive concepts, each of the input nodes 103a, 111a to 113a, 121a to 123a, and 131a and each of the output nodes 103b, 111b to 113b, 121b to 123b, and 131b may be connected to one main penetration electrode included in the group corresponding thereto, spare penetration electrodes disposed at both sides of the corresponding group, and a spare penetration electrode spaced apart from the corresponding group, unlike the fifth embodiment of the inventive concepts.

For example, the first group first input/output nodes 111a and 111b may be connected to the first group first main penetration electrode 111, the first spare penetration electrode 211 disposed at one side of the first group 110, the second spare penetration electrode 211 disposed at another side of the first group 110, and a third spare penetration electrode 231 spaced apart from the first group 110. By the same manner as the first group first input/output nodes 111a and 111b, the first group second input/output nodes 112a and 112b may be connected to the first group second main penetration electrode 112 and the first to third spare penetration electrodes 211, 221, and 231, and the first group third input/output nodes 113a and 113b may be connected to the first group third main penetration electrode 113 and the first to third spare penetration electrodes 211, 221, and 231. Thus, when defects occur at the main penetration electrodes 111 to 113 of the first group 110, the first to third spare penetration electrodes 211, 221, and 231 may be substituted for the defective ones of the main penetration electrodes 111 to 113 of the first group 110 and may transfer or transmit I/O signals.

Each of the spare penetration electrodes 211, 221, and 232 between the groups 100, 110, 120, and 130 may be connected to the input nodes and the output nodes of the groups disposed at both sides thereof and the group spaced apart therefrom.

For example, the third spare penetration electrode 231 may be connected to the first to third group first to third input/output nodes 111a to 113a, 111b to 113b, 131a, and 131*b*. Thus, when a defect occurs at the main penetration electrodes 111 to 113, 121 to 123, and 131 of the first, second, and third groups 110, 120, and 130, the third spare penetration electrode 231 may transfer or transmit I/O signals in substitution for the defective one(s) of the main penetration electrodes 111 to 113, 121 to 123, and 131 of the first, second, and third groups 110, 120, and 130.

According to a seventh embodiment of the inventive concepts, the input/output nodes may be connected to the penetration electrodes in such a way that some of the input/output nodes and the others of the input/output nodes are symmetrical. This will be described with reference to FIG. 10.

Figure 10:
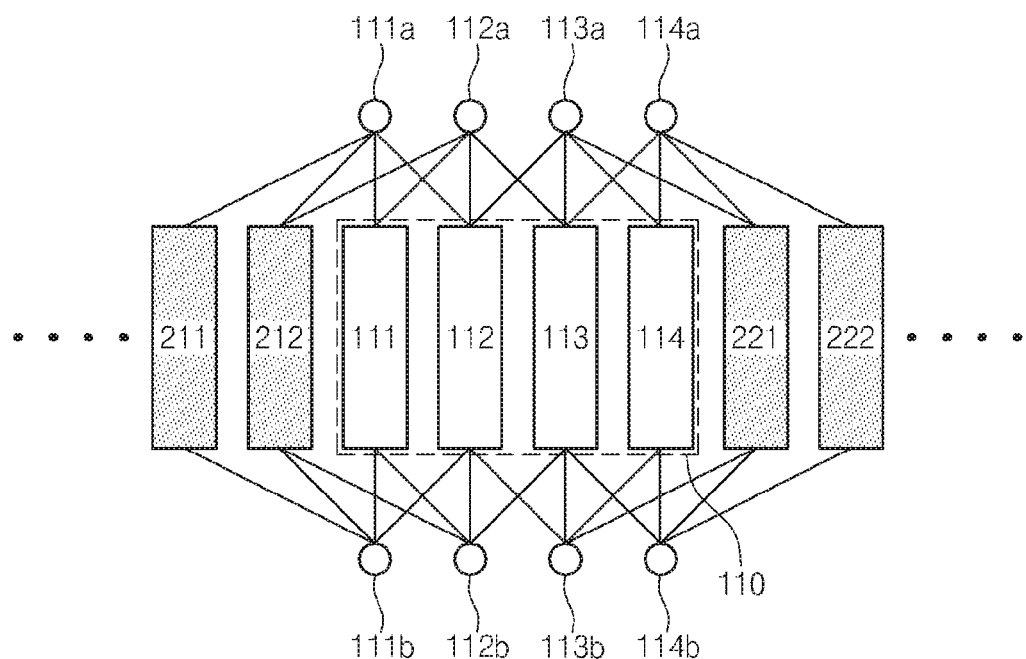
FIG. 10 is a view illustrating a semiconductor device having a repairable penetration electrode, according to a seventh embodiment of the inventive concepts.

FIG. 10 is a view illustrating a semiconductor device having a repairable penetration electrode, according to a seventh embodiment of the inventive concepts.

Referring to FIG. 10, according to the seventh embodiment of the inventive concepts, the input/output nodes 111*a* to 114*a* and 111*b* to 114*b* may be connected to the main penetration electrodes 111 to 114 and the spare penetration electrodes 211, 212, 221, and 222 in such a way that the first group first input/output nodes 111*a* and 111*b* and the first group second input/output nodes 112*a* and 112*b* are symmetrical with the first group third input/output nodes 113*a* and 113*b* and the first group fourth input/output nodes 114*a* and 114*b*.

In more detail, the first group first input/output nodes 111*a* and 111*b* may be connected to the first spare penetration electrodes 211 and 212, the first group first main penetration electrode 111, and the first group second main penetration electrode 112, and the first group second input/output nodes 112*a* and 112*b* may be connected to the first spare penetration electrode 212 adjacent to the first group 110 and the first group first to third main penetration electrodes 111 to 113. The first group third input/output nodes 113*a* and 113*b* may be connected to the first group second to fourth main penetration electrodes 112 to 114 and the second spare penetration electrode 221 adjacent to the first group 110, and the first group fourth input/output nodes 114*a* and 114*b* may be connected to the first group third and fourth main penetration electrodes 113 and 114 and the second spare penetration electrodes 221 and 222. Thus, the input/output nodes may be connected to the penetration electrodes in such a way that some 111*a*, 111*b*, 112*a*, and 112*b* of the input/output nodes and the others 113*a*, 113*b*, 114*a*, and 114*b* of the input/output nodes are symmetrical with respect to a region between the second and third input/output nodes 112*a*, 113*a*, 112*b*, and 113*b*.

Unlike the seventh embodiment of the inventive concepts, the input/output nodes may be connected to the penetration electrodes in such a way that some of the input/output nodes and the others of the input/output nodes are asymmetrical, according to eighth and ninth embodiments of the inventive concepts. These will be described with reference to FIGS. 11 and 12.

Figure 11:
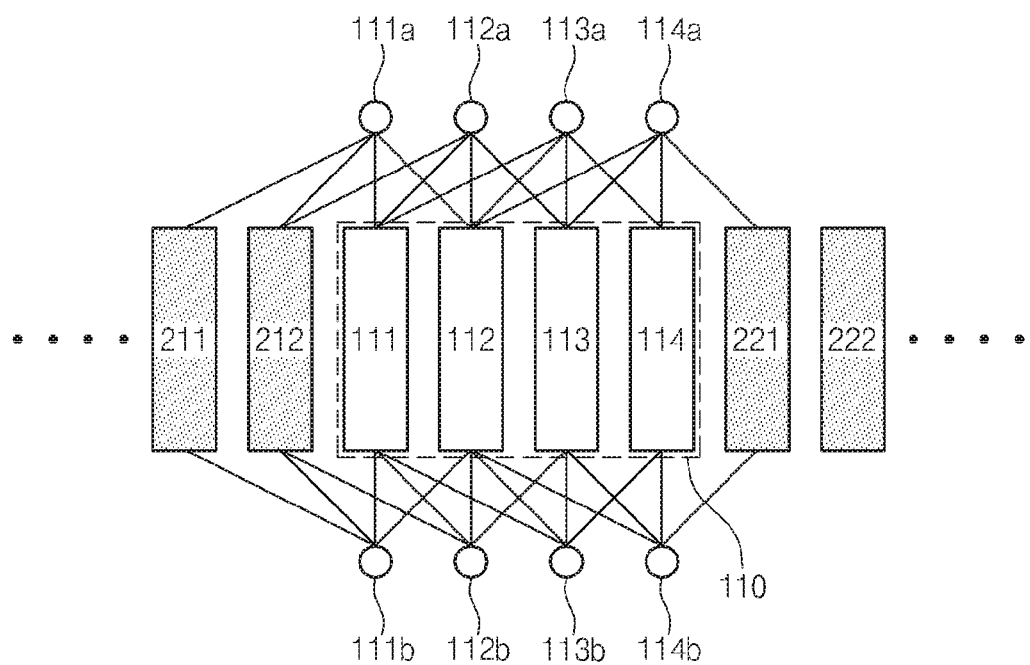
FIG. 11 is a view illustrating a semiconductor device having a repairable penetration electrode, according to an eighth embodiment of the inventive concepts.

FIG. 11 is a view illustrating a semiconductor device having a repairable penetration electrode, according to an eighth embodiment of the inventive concepts.

Referring to FIG. 11, according to the eighth embodiment of the inventive concepts, the input nodes 111*a* to 114*a* and the output nodes 111*b* to 114*b* may be connected to the penetration electrodes 111 to 114, 211, 212, and 221 in a state in which they 111*a* to 114*a* and 111*b* to 114*b* are shifted to the left, unlike the seventh embodiment described above.

In more detail, the first group first input/output nodes 111*a* and 111*b* may be connected to the first spare penetration electrodes 211 and 212, the first group first main penetration electrode 111, and the first group second main penetration electrode 112, and the first group second input/output nodes 112*a* and 112*b* may be connected to the first spare penetration electrode 212 adjacent to the first group 110 and the first group first to third main penetration electrodes 111 to 113. The first group third input/output nodes 113*a* and 113*b* may be connected to the first group first to fourth main penetration electrodes 111 to 114 but may be disconnected from the spare penetration electrodes 211, 212, 221, and 222. The first group fourth input/output nodes 114*a* and 114*b* may be connected to the first group second to fourth main penetration electrodes 112 to 114 and the second spare penetration electrode 221 adjacent to the first group 110. Thus, the input nodes 111*a* to 114*a* and the output nodes 111*b* to 114*b* may be connected to the penetration electrodes 111 to 114, 211, 212, and 221 in the state in which they are shifted to the left.

Figure 12:
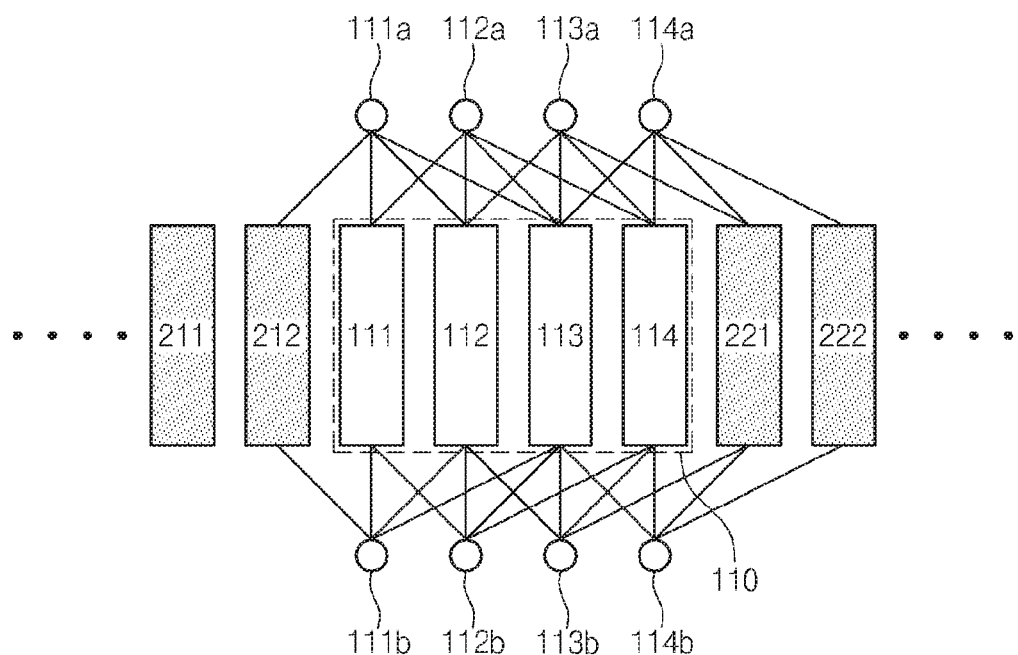
FIG. 12 is a view illustrating a semiconductor device having a repairable penetration electrode, according to a ninth embodiment of the inventive concepts.

FIG. 12 is a view illustrating a semiconductor device having a repairable penetration electrode, according to a ninth embodiment of the inventive concepts.

Referring to FIG. 12, according to the ninth embodiment of the inventive concepts, the input nodes 111*a* to 114*a* and the output nodes 111*b* to 114*b* may be connected to the penetration electrodes 111 to 114, 212, 221, and 222 in a state in which they 111*a* to 114*a* and 111*b* to 114*b* are shifted to the right, unlike the seventh and eighth embodiments described above.

In more detail, the first group first input/output nodes 111*a* and 111*b* may be connected to the first spare penetration electrode 212 adjacent to the first group 110 and the first group first to third main penetration electrodes 111 to 113. The first group second input/output nodes 112*a* and 112*b* may be disconnected from the spare penetration electrodes 211, 212, 221, and 222 and may be connected to the first group first to fourth main penetration electrodes 111 to 114. The first group third input/output nodes 113*a* and 113*b* may be connected to the first group second to fourth main penetration electrodes 112 to 114 and the second spare penetration electrode 221 adjacent to the first group 110, and the first group fourth input/output nodes 114*a* and 114*b* may be connected to the first group third and fourth main penetration electrodes 113 and 114 and the second spare penetration electrodes 221 and 222. Thus, the input nodes 111*a* to 114*a* and the output nodes 111*b* to 114*b* may be connected to the penetration electrodes 111 to 114, 212, 221, and 222 in the state in which they are shifted to the right.

According to a tenth embodiment of the inventive concepts, an input node and an output node corresponding to a first group may be connected to a penetration electrode included in a second group adjacent to the first group in a direction parallel to a top surface of a substrate that penetration electrodes penetrate. This will be described with reference to FIG. 13.

Figure 13:
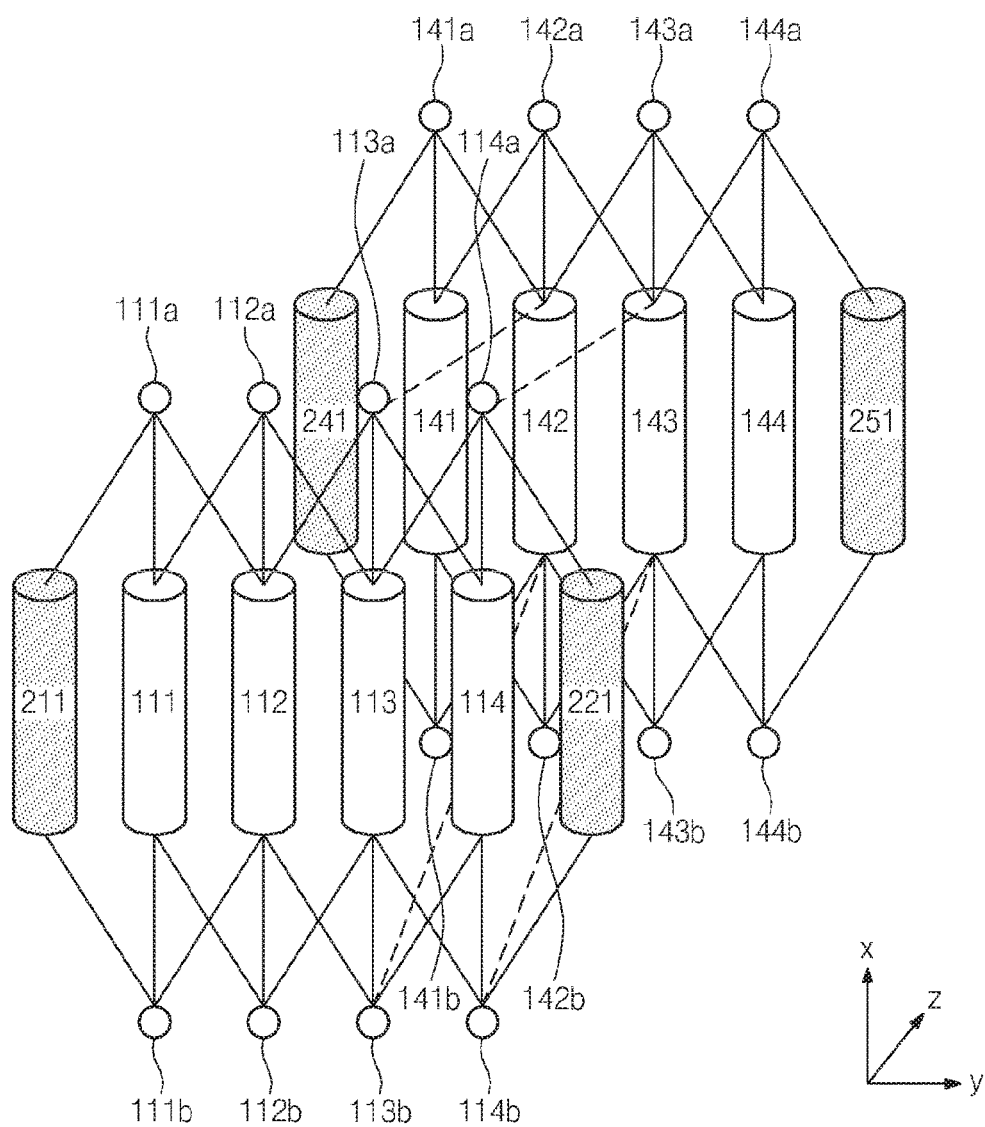
FIG. 13 is a view illustrating a semiconductor device having a repairable penetration electrode, according to a tenth embodiment of the inventive concepts.

FIG. 13 is a view illustrating a semiconductor device having a repairable penetration electrode, according to a tenth embodiment of the inventive concepts.

Referring to FIG. 13, according to the tenth embodiment of the inventive concepts, main penetration electrodes 111 to 114 and 141 to 144 and spare penetration electrodes 211, 221, 241, and 251 are provided. The main penetration electrodes 111 to 114 and 141 to 144 and the spare penetration electrodes 211, 221, 241, and 251 may extend in a first direction (e.g., an x-axis direction in FIG. 13) to penetrate a semiconductor substrate.

A first group may be defined to include the main penetration electrodes 111 to 114 which are disposed between a first spare penetration electrode 211 and a second spare penetration electrode 221 in a second direction (e.g., a y-axis direction in FIG. 13) perpendicular to the first direction (the x-axis direction in FIG. 13) and are arranged in the second direction (the y-axis direction in FIG. 13).

A fourth group may be defined to include the main penetration electrodes 141 to 144 which are disposed between a fourth spare penetration electrode 241 and a fifth spare penetration electrode 251 in the second direction (the y-axis direction in FIG. 13) and are arranged in the second direction (the y-axis direction in FIG. 13). The fourth group may be spaced apart from the first group in a third direction (e.g., a z-axis direction in FIG. 13) perpendicular to the first direction and second direction. In other words, the fourth group may be spaced apart from the first group in a direction which is perpendicular to the arrangement direction of the first group main penetration electrodes 111 to 114 and is parallel to a top surface of the semiconductor substrate which the main penetration electrodes 111 to 114 and 141 to 144 and the spare penetration electrodes 211, 221, 241, and 251 penetrate.

Input nodes 111a to 114a and output nodes 111b to 114b corresponding to the first group may be connected to the fourth group main penetration electrodes 141 to 144. In FIG. 13, first group third and fourth input/output nodes 113a, 114a, 113b, and 114b are connected to the fourth group second and third main penetration electrodes 142 and 143. However, to increase repair efficiency, the first group input/output nodes 111a to 114a and 111b to 114b may be connected to the fourth group main penetration electrodes 141 to 144 and the fourth and fifth spare penetration electrodes 241 and 251 by various methods.

Even though the input nodes and the output nodes are connected to the same number the main penetration electrodes and the spare penetration electrodes, a signal shift may not be generated according to a connecting method. These will be described with reference to FIGS. 14 and 15.

Figure 14:
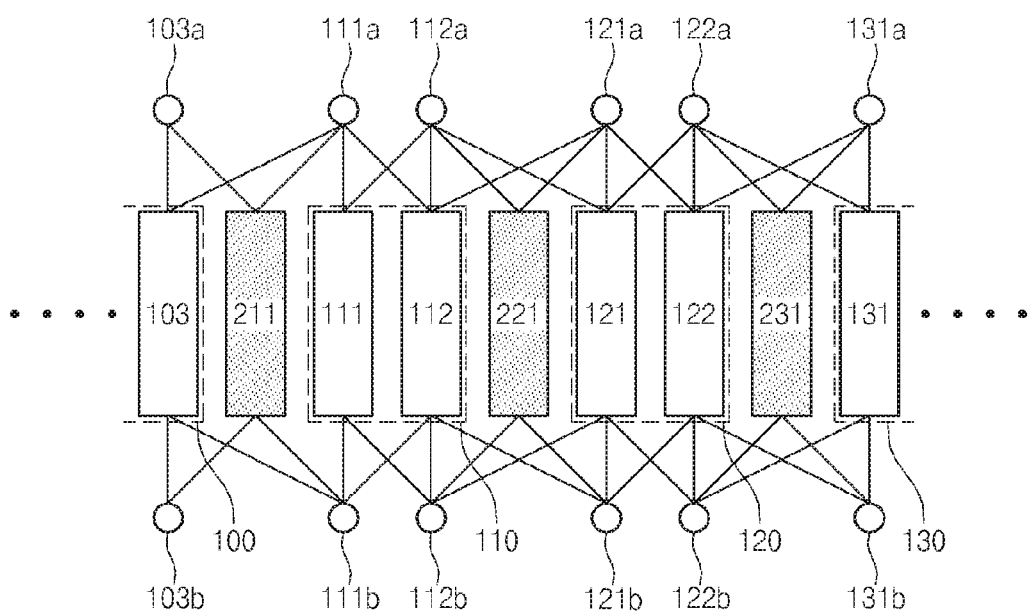
FIG. 14 is a view illustrating a semiconductor device having a repairable penetration electrode, according to an eleventh embodiment of the inventive concepts.

FIG. 14 is a view illustrating a semiconductor device having a repairable penetration electrode, according to an eleventh embodiment of the inventive concepts.

Referring to FIG. 14, according to the eleventh embodiment of the inventive concepts, two main penetration electrodes 103, 111 and 112, 121 and 122, or 131 may be provided in each of groups 100, 110, 120, and 130, and one spare penetration electrode 211, 221, or 231 may be provided between the groups adjacent to each other.

Each of the input nodes 103a, 111a, 112a, 121a, 122a, and 131a and each of the output nodes 103b, 111b, 112b, 121b, 122b, and 131b may be connected to the main penetration electrodes 103, 111 and 112, 121 and 122, or 131 of a corresponding one of the groups 100, 110, 120, and 130, the spare penetration electrode 211, 221, or 231 disposed at a side of the corresponding group 100, 110, 120, or 130, and the main penetration electrode 103, 111, 112, 121, 122, or 131 of another group adjacent to the corresponding group 100, 110, 120, or 130.

For example, the first group first input/output nodes 111a and 111b may be connected to the main penetration electrodes 111 and 112 of the first group 110, the first spare penetration electrode 211 disposed at a side of the first group 110, and the main penetration electrode 103 of the zeroth group 100 adjacent to the first group 110.

If defects occurs at the first group main penetration electrodes 111 and 112 and the second group first main penetration electrode 121, the first spare penetration electrode 211 or the zeroth group main penetration electrode 103 may be substituted for the first group first main penetration electrode 111 to transmit I/O signals, the second spare penetration electrode 221 may be substituted for the first group second main penetration electrode 112 to transmit I/O signals, and the second group second main penetration electrode 122 may be substituted for the second group first main penetration electrode 121 to transmit I/O signals.

The second group second main penetration electrode 122 transmitting a signal between the second group second input/output nodes 122a and 122b without a defect may be substituted for the second group first main penetration electrode 121, thereby generating a signal shift phenomenon that the signal between the second group second input/output nodes 122a and 122b is transmitted through the third spare penetration electrode 231 or the third group main penetration electrode 131. The signal shift phenomenon may not be generated according to a connecting method of the input/output nodes 103a, 111a, 112a, 121a, 122a, 131a, 103b, 111b, 112b, 121b, 122b, and 131b and the penetration electrodes 103, 111, 112, 121, 122, 131, 211, 221, and 231. This will be described with reference to FIG. 15.

Figure 15:
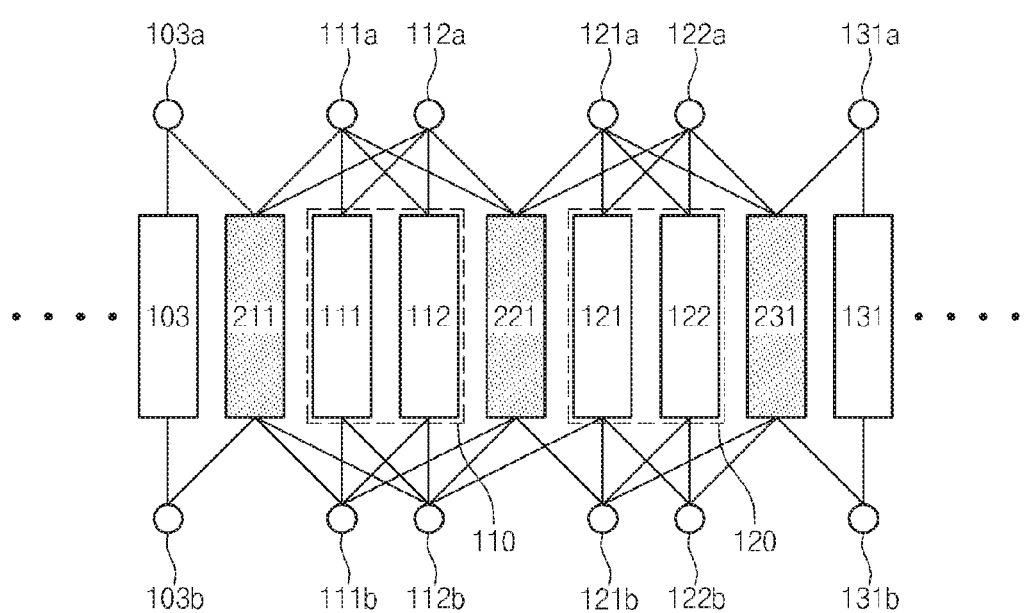
FIG. 15 is a view illustrating a semiconductor device having a repairable penetration electrode, according to a twelfth embodiment of the inventive concepts.

FIG. 15 is a view illustrating a semiconductor device having a repairable penetration electrode, according to a twelfth embodiment of the inventive concepts.

Referring to FIG. 15, according to the twelfth embodiment of the inventive concepts, each of the input nodes 103a, 111a, 112a, 121a, 122a, and 131a and each of the output nodes 103b, 111b, 112b, 121b, 122b, and 131b may be connected to the same number of the penetration electrodes as in the aforementioned eleventh embodiment of the inventive concepts and, however, may be connected to more spare penetration electrodes than in the aforementioned eleventh embodiment of the inventive concepts.

In other words, each of the input nodes 103a, 111a, 112a, 121a, 122a, and 131a and each of the output nodes 103b, 111b, 112b, 121b, 122b, and 131b may be connected to the main penetration electrodes 103, 111 and 112, 121 and 122, or 131 of the corresponding one of the groups 100, 110, 120, and 130 and the spare penetration electrodes disposed at both sides of the corresponding group 100, 110, 120, or 130 and may be disconnected from the main penetration electrodes 103, 111, 112, 121, 122, or 131 of another group adjacent to the corresponding group 100, 110, 120, or 130.

For example, the first group first input/output nodes 111a and 111b may be connected to the main penetration electrodes 111 and 112 of the first group 110 and first and second spare penetration electrodes 211 and 221 disposed at both sides of the first group 110.

If defects occurs at the first group main penetration electrodes 111 and 112 and the second group first main penetration electrode 121 as described in the above eleventh embodiment of the inventive concepts, the first spare penetration electrode 211 may be substituted for the first group first main penetration electrode 111 to transmit I/O signals, the second spare penetration electrode 221 may be substituted for the first group second main penetration electrode 112 to transmit I/O signals, and the third spare penetration electrode 231 may be substituted for the second group first main penetration electrode 121 to transmit I/O signals.

Unlike the above eleventh embodiment of the inventive concepts, the third spare penetration electrode 231 may be substituted for the second group first main penetration electrode 121, and thus the signal between the second group second input/output nodes 122a and 122b may be transmitted through the second group second main penetration electrode 122. As a result, the signal shift phenomenon may not be generated.

The input nodes and the output nodes according to the first to twelfth embodiments described above may include a combination of a node and a multiplexer or demultiplexer. Hereinafter, these will be described with reference to FIGS. 16A to 16D.

Figure 16A:
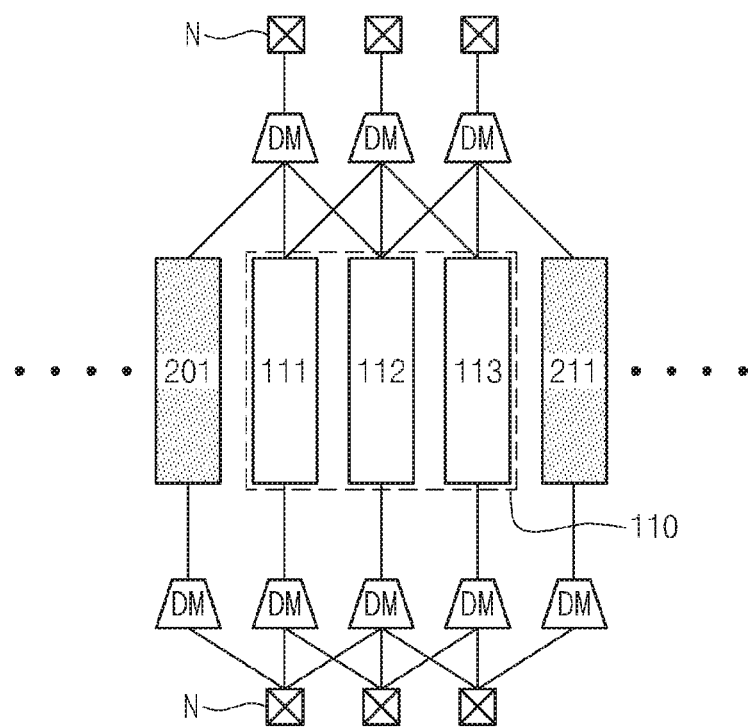
FIG. 16A is a view illustrating a first embodiment of an input node and an output node included in the semiconductor device having the repairable penetration electrode described with reference to FIG. 3.

FIG. 16A is a view illustrating a first embodiment of an input node and an output node included in the semiconductor device having the repairable penetration electrode described with reference to FIG. 3.

Referring to FIG. 16A, according to the first embodiment of an input node and an output node included in a semiconductor device having a repairable penetration electrode, input nodes corresponding to a first group 110 may be configured using nodes N corresponding to the number of main penetration electrodes 111 to 113 of the first group 110 and demultiplexers DM corresponding to the number of the main penetration electrodes 111 to 113 of the first group 110. In this case, the nodes N may be connected one-to-one to the demultiplexers DM, and each of the demultiplexers DM may be connected to at least two of penetration electrodes 111 to 113, 201, and 211.

Output nodes corresponding to the first group 110 may be configured using nodes N corresponding to the number of the main penetration electrodes 111 to 113 of the first group 110 and demultiplexers DM corresponding to the number of penetration electrodes 111 to 113, 201, and 211 connected to the output nodes corresponding to the first group 110. In this case, each of the nodes N may be connected to a plurality of the demultiplexers DM, and the demultiplexers DM may be connected one-to-one to the penetration electrodes 111 to 113, 201, and 211.

Figure 16B:
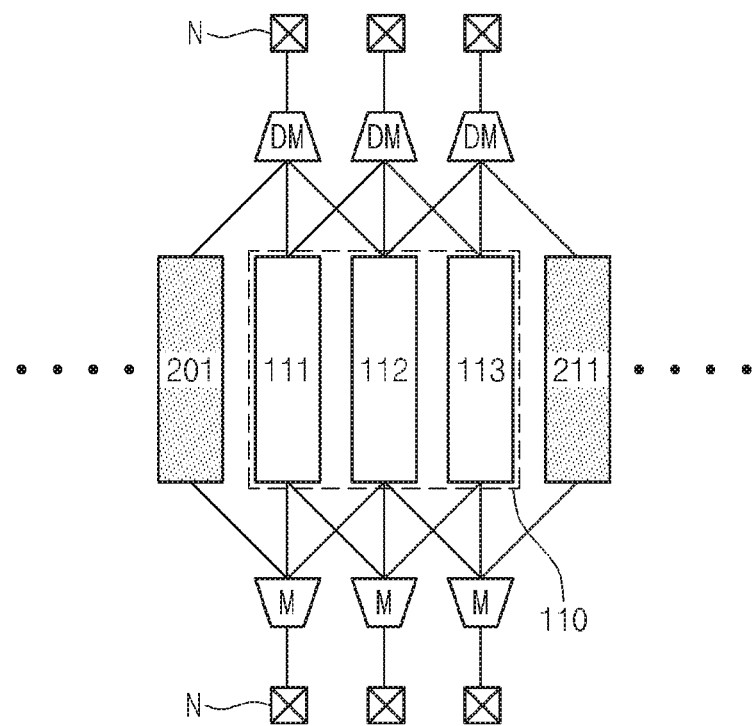
FIG. 16B is a view illustrating a second embodiment of the input node and the output node included in the semiconductor device having the repairable penetration electrode described with reference to FIG. 3.

FIG. 16B is a view illustrating a second embodiment of the input node and the output node included in the semiconductor device having the repairable penetration electrode described with reference to FIG. 3.

Referring to FIG. 16B, according to the second embodiment of an input node and an output node included in a semiconductor device having a repairable penetration electrode, input nodes corresponding to a first group 110 may be configured by the same method as the input nodes described with reference to FIG. 16A.

Output nodes corresponding to the first group 110 may be configured using nodes N corresponding to the number of main penetration electrodes 111 to 113 of the first group 110 and multiplexers M corresponding to the number of the main penetration electrodes 111 to 113 of the first group 110. In this case, the nodes N may be connected one-to-one to the multiplexers M, and each of the multiplexers M may be connected to at least two of penetration electrodes 111 to 113, 201, and 211.

Figure 16C:
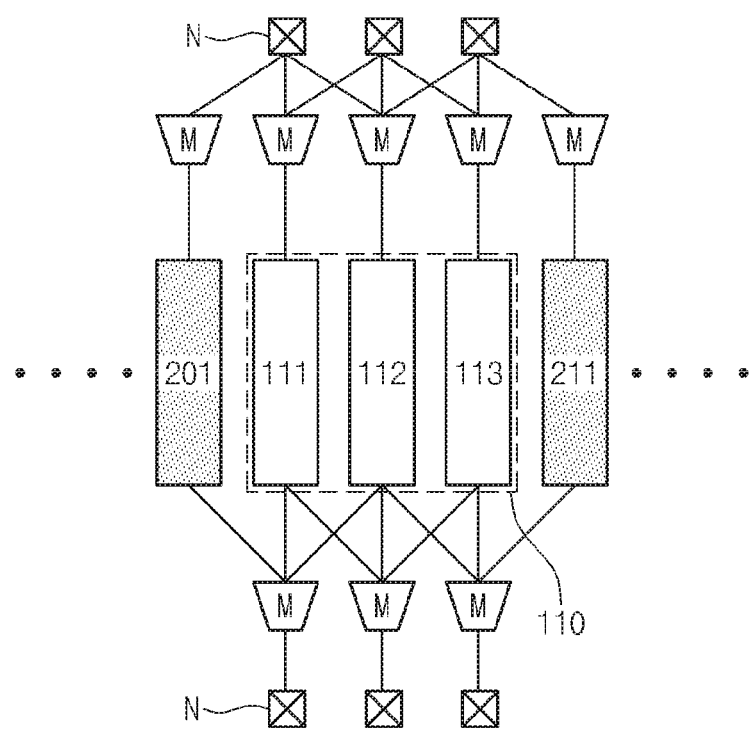
FIG. 16C is a view illustrating a third embodiment of the input node and the output node included in the semiconductor device having the repairable penetration electrode described with reference to FIG. 3.

FIG. 16C is a view illustrating a third embodiment of the input node and the output node included in the semiconductor device having the repairable penetration electrode described with reference to FIG. 3.

Referring to FIG. 16C, according to the third embodiment of an input node and an output node included in a semiconductor device having a repairable penetration electrode, input nodes corresponding to a first group 110 may be configured using nodes N corresponding to the number of main penetration electrodes 111 to 113 of the first group 110 and multiplexers M corresponding to the number of penetration electrodes 111 to 113, 201, and 211 connected to the input nodes corresponding to the first group 110. In this case, each of the nodes N may be connected to a plurality of the multiplexers M, and the multiplexers M may be connected one-to-one to the penetration electrodes 111 to 113, 201, and 211.

Output nodes corresponding to the first group 110 may be configured by the same method as the output nodes described with reference to FIG. 16B.

Figure 16D:
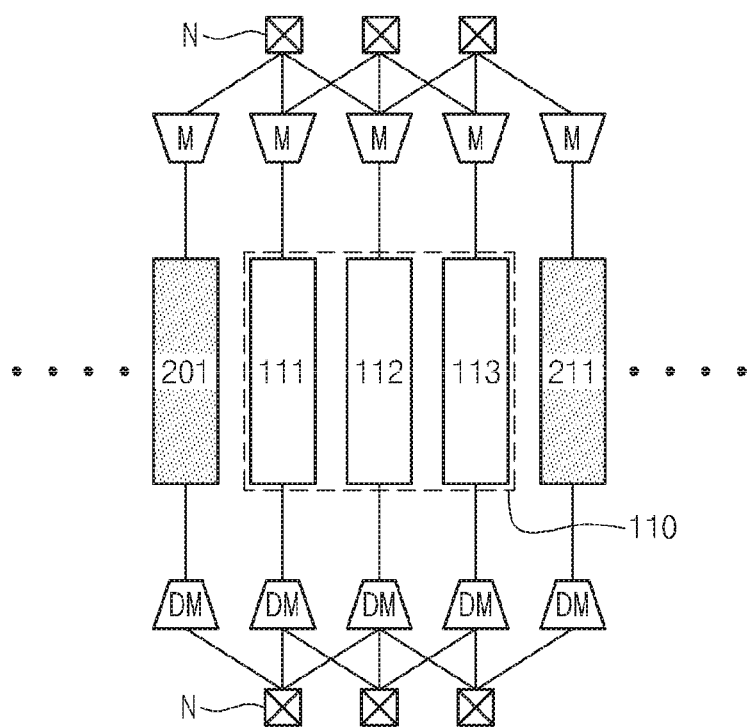
FIG. 16D is a view illustrating a fourth embodiment of the input node and the output node included in the semiconductor device having the repairable penetration electrode described with reference to FIG. 3.

FIG. 16D is a view illustrating a fourth embodiment of the input node and the output node included in the semiconductor device having the repairable penetration electrode described with reference to FIG. 3.

Referring to FIG. 16D, according to the fourth embodiment of an input node and an output node included in a semiconductor device having a repairable penetration electrode, input nodes corresponding to a first group 110 may be configured by the same method as the input nodes described with reference to FIG. 16C. Output nodes corresponding to the first group 110 may be configured by the same method as the output nodes described with reference to FIG. 16A.

Figure 17:
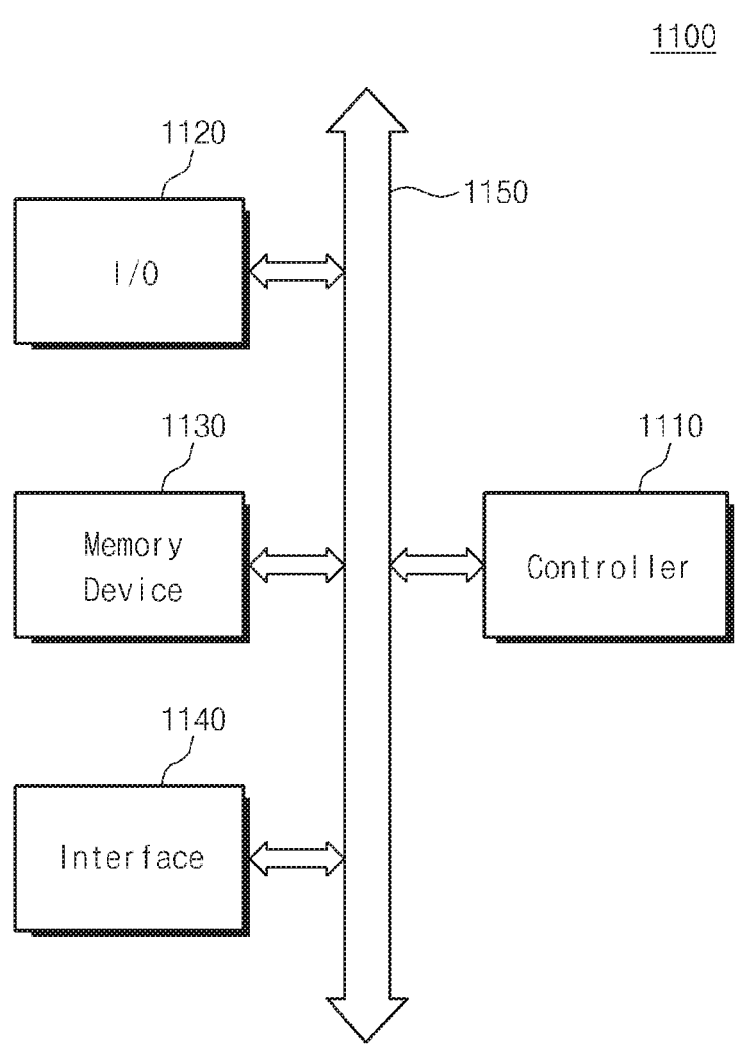
FIG. 17 is a schematic block diagram illustrating an example of an electronic system including a semiconductor device having a repairable penetration electrode according to example embodiments of the inventive concepts.

FIG. 17 is a schematic block diagram illustrating an example of an electronic system including a semiconductor device having a repairable penetration electrode according to example embodiments of the inventive concepts.

Referring to FIG. 17, an electronic system 1100 according to an embodiment of the inventive concepts may include a controller 1110, an input/output (I/O) unit 1120, a memory device 1130, an interface unit 1140 and a data bus 1150. The controller 1110, the I/O unit 1120, the memory device 1130 and/or the interface unit 1140 may be coupled to each other through the data bus 1150. The data bus 1150 may correspond to a path through which data are transmitted.

The controller 1110 may include at least one of a microprocessor, a digital signal processor, a microcontroller, or other logic device. The other logic device may have a similar function to any one of the microprocessor, the digital signal processor and the microcontroller. The I/O unit 1120 may include a keypad, a keyboard and/or a display device. The memory device 1130 may store data and/or commands. The memory device 1130 may include at least one of three-dimensional stack resistive memory devices described in the aforementioned embodiments of the inventive concepts. In addition, the memory device 1130 may further include another kind of a semiconductor memory device (e.g., a dynamic random access memory (DRAM) device and/or a static random access memory (SRAM) device).

The interface unit 1140 may transmit data to a communication network or may receive data from a communication network. The interface unit 1140 may operate by wireless or cable. For example, the interface unit 1140 may include an antenna or a cable/wireless transceiver. Even though not shown in the drawings, the electronic system 1100 may further include a fast DRAM device and/or a fast SRAM device which acts as an operating memory for improving an operation of the controller 1110.

The electronic system 1100 may be applied to a personal digital assistant (PDA), a portable computer, a web tablet, a wireless phone, a mobile phone, a digital music player, a memory card, or other electronic products transmitting and/or receiving information data by wireless.

Figure 18:
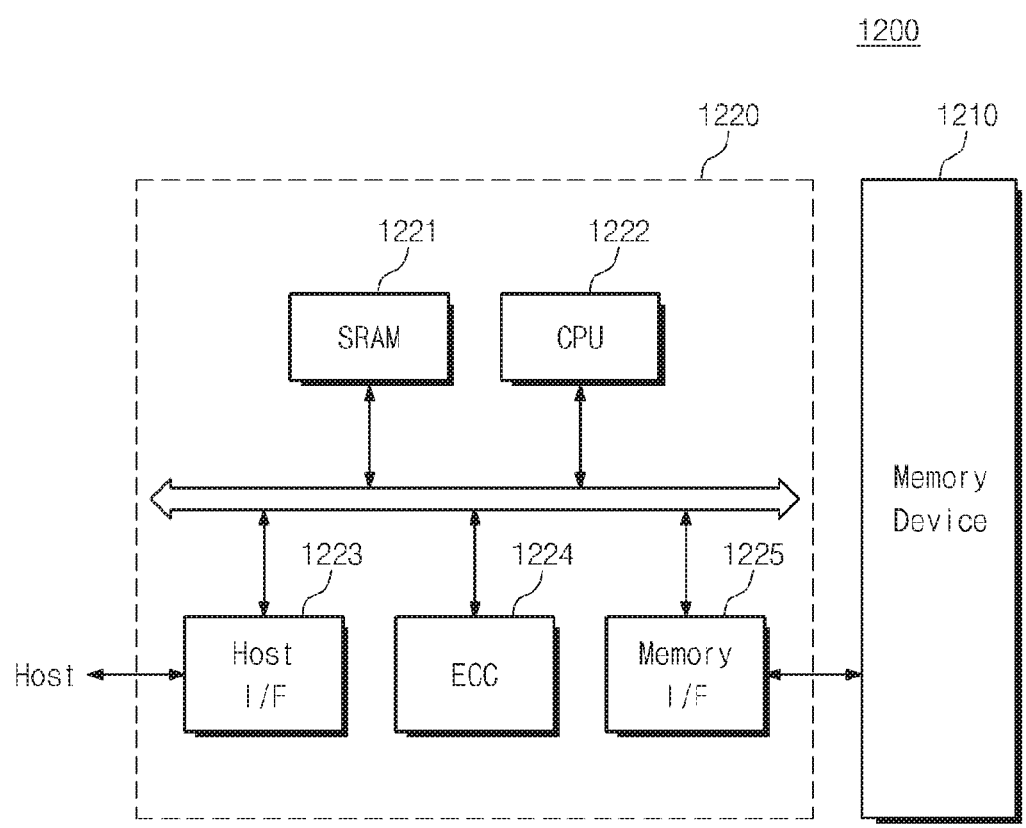
FIG. 18 is a schematic block diagram illustrating an example of a memory card including a semiconductor device having a repairable penetration electrode according to example embodiments of the inventive concepts.

FIG. 18 is a schematic block diagram illustrating an example of a memory card including a semiconductor device having a repairable penetration electrode according to example embodiments of the inventive concepts.

Referring to FIG. 18, a memory card 1200 according to an embodiment of the inventive concepts may include a memory device 1210. The memory device 1210 may include at least one of three-dimensional stack resistive memory devices described in the aforementioned embodiments of the inventive concepts. In addition, the memory device 1210 may further include another kind of a semiconductor memory device (e.g., a DRAM device and/or a SRAM device). The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operating memory of the CPU 1222. Moreover, the memory controller 1220 may further include a host interface unit 1223 and a memory interface unit 1225.

The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224.

The ECC block 1224 may detect and correct errors of data which are read out from the memory device 1210. Even though not shown in the drawings, the memory card 1200 may further include a read only memory (ROM) device that stores code data for interfacing with the host. The memory card 1200 may be used as a portable data storage card. Alternatively, the memory card 1200 may be realized as solid state disks (SSD) which are used as hard disks of computer systems.

The semiconductor device according to the aforementioned embodiments of the inventive concepts may be used in various electronic systems, and the electronic system including the semiconductor device according to the aforementioned embodiments of the inventive concepts may be used in a personal digital assistant (PDA), a portable computer, a web tablet, a wireless phone, a mobile phone, a memory card, and the like.

The semiconductor device having the repairable penetration electrode according to example embodiments of the inventive concepts may include the first and second signal transfer regions including the main penetration electrodes penetrating the substrate, and the repair region including the spare penetration electrode penetrating the substrate. The first and second signal transfer regions may be spaced apart from each other, and the repair region may be disposed between the first and second signal transfer regions. The first and second signal transfer regions may share the repair region, and thus the signal penetration electrode of the repair region may be substituted for the defective main penetration electrode of the first and second signal transfer regions. As a result, the repair efficiency may be improved.

While the inventive concepts have been described with reference to exemplary embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device having a repairable penetration electrode, the semiconductor device comprising:
   input nodes;
   output nodes; and
   penetration electrodes disposed between the input nodes and the output nodes and penetrating a substrate,
   wherein the penetration electrodes comprise: main penetration electrodes connected to the input nodes and the output nodes to transmit input/output (I/O) signals; and
   a spare penetration electrode,
   wherein the main penetration electrodes adjacent to each other constitute a group,
   wherein the group includes a first group and a second group,
   wherein the spare penetration electrode is disposed between the first group and the second group,
   wherein the input nodes and the output nodes corresponding to the first and second groups are connected to the spare penetration electrode, and
   wherein, when a defect occurs at the main penetration electrodes of the first and second groups, the spare penetration electrode is substituted for the defective main penetration electrode of the first and second groups to transmit the I/O signal.

2. The semiconductor device of claim 1, wherein the spare penetration electrode includes spare penetration electrodes that are provided at both sides of the first group, respectively,
   wherein at least two of the input nodes corresponding to the first group are connected to the spare penetration electrodes provided at both sides of the first group, and
   wherein at least two of the output nodes corresponding to the first group are connected to the spare penetration electrodes provided at both sides of the first group.

3. The semiconductor device of claim 2, wherein at least one of the output nodes and/or the input nodes corresponding to the first group is electrically disconnected from the spare penetration electrodes.

4. The semiconductor device of claim 1, wherein at least one of the input nodes corresponding to the first group and/or the output nodes corresponding to the first group is connected to the main penetration electrode included in the first group, the spare penetration electrode adjacent to the first group, and the main penetration electrode included in the second group adjacent to the first group, and
   wherein, when a defect occurs at the main penetration electrode of the first group, the spare penetration electrode and/or the main penetration electrode of the second group connected to the at least one node is substituted for the defective main penetration electrode of the first group to transmit the I/O signal.

5. The semiconductor device of claim 4, wherein the second group is adjacent to the first group in a direction that is parallel to a top surface of the substrate and that is perpendicular to an arrangement direction of the main penetration electrodes included in the first group.

6. The semiconductor device of claim 1, wherein the number of the input nodes and/or the number of the output nodes is equal to the number of the main penetration electrodes.

7. The semiconductor device of claim 1, wherein the input nodes and/or the output nodes are connected to the same number of the penetration electrodes.

8. The semiconductor device of claim 7, wherein the number of the main penetration electrode connected to one of the input nodes is different from the number of the main penetration electrode connected to another of the input nodes, and
   wherein the number of the spare penetration electrode connected to one of the input nodes is different from the number of the spare penetration electrode connected to another of the input nodes.

9. The semiconductor device of claim 7, wherein the number of the main penetration electrode connected to one of the output nodes is different from the number of the main penetration electrode connected to another of the output nodes, and wherein the number of the spare penetration electrode connected to one of the output nodes is different from the number of the spare penetration electrode connected to another of the output nodes.

10. The semiconductor device of claim 7, wherein the number of the main penetration electrode connected to the input nodes and/or the output nodes is more than the number of the spare penetration electrode connected to the input nodes and/or the output nodes.

11. The semiconductor device of claim 1, wherein the spare penetration electrode includes spare penetration electrodes that are provided at both sides of the first group, respectively, wherein each of the input nodes corresponding to the first group and each of the output nodes corresponding to the first group are connected to one of the main penetration electrodes of the first group and the spare penetration electrodes provided at both sides of the first group, wherein, when a defect occurs at the main penetration electrode of the first group, any one of the spare penetration electrodes provided at both sides of the first group is substituted for the defective main penetration electrode to transmit the I/O signal.

12. The semiconductor device of claim 1, wherein the group further includes: a third group spaced apart from the first group with the second group interposed therebetween, wherein the spare penetration electrode includes: a first spare penetration electrode provided at a side of the third group adjacent to the second group; and a second spare penetration electrode provided at another side of the third group, wherein the input nodes and the output nodes corresponding to the third group are connected to the first and second spare penetration electrodes, and wherein, when a defect occurs at the main penetration electrode of the third group, any one of the first and second spare penetration electrodes is substituted for the defective main penetration electrode of the third group to transmit the I/O signal.

13. The semiconductor device of claim 12, wherein at least one of the input nodes and the output nodes corresponding to the first group is connected to the second spare penetration electrode, and wherein, when a defect occurs at the main penetration electrode included in the first group, the second spare penetration electrode is substituted for the defective main penetration electrode of the first group to transmit the I/O signal.

14. The semiconductor device of claim 12, wherein at least one of the input nodes and the output nodes corresponding to the first group is connected to the main penetration electrode of the third group, and wherein, when a defect occurs at the main penetration electrode of the first group, the main penetration electrode of the third group is substituted for the defective main penetration electrode of the first group to transmit the I/O signal.

15. The semiconductor device of claim 1, wherein the input nodes and the output nodes include a multiplexer and/or a demultiplexer.

* * * * *